United States Patent
Chun et al.

(10) Patent No.: US 10,886,167 B2
(45) Date of Patent: Jan. 5, 2021

(54) SEMICONDUCTOR DEVICE FOR IMPROVING DEVICE CHARACTERISTICS

(71) Applicant: Samsung Electronics Co., Ltd., Suwon-si (KR)

(72) Inventors: Jin-hwan Chun, Seongnam-si (KR); Hui-jung Kim, Seongnam-si (KR); Keun-nam Kim, Yongin-si (KR); Sung-hee Han, Hwaseong-si (KR); Yoo-sang Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/258,815

(22) Filed: Jan. 28, 2019

(65) Prior Publication Data

US 2020/0035541 A1   Jan. 30, 2020

(30) Foreign Application Priority Data

Jul. 27, 2018 (KR) .................. 10-2018-0088153

(51) Int. Cl.
   *H01L 21/768* (2006.01)
   *H01L 21/762* (2006.01)
   *H01L 21/764* (2006.01)
   *H01L 29/06* (2006.01)
   *H01L 27/108* (2006.01)

(52) U.S. Cl.
   CPC ........ *H01L 21/7682* (2013.01); *H01L 21/764* (2013.01); *H01L 21/76224* (2013.01); *H01L 27/10885* (2013.01); *H01L 27/10888* (2013.01); *H01L 27/10891* (2013.01); *H01L 29/0649* (2013.01)

(58) Field of Classification Search
   None
   See application file for complete search history.

(56) References Cited

U.S. PATENT DOCUMENTS

| 8,987,860 | B2 | 3/2015 | Song et al. |
| 9,012,321 | B1 * | 4/2015 | Kim ................. H01L 27/10823 438/620 |
| 9,425,200 | B2 | 8/2016 | Hwang et al. |
| 9,515,022 | B2 | 12/2016 | Kwon et al. |

(Continued)

FOREIGN PATENT DOCUMENTS

KR   10-2015-0045782 A   4/2015

*Primary Examiner* — Zandra V Smith
*Assistant Examiner* — Lawrence C Tynes, Jr.
(74) *Attorney, Agent, or Firm* — Harness, Dickey & Pierce, P.L.C.

(57) ABSTRACT

A semiconductor device includes: a substrate having active regions defined by a device isolation region; a conductive line extending in a direction on the active regions; insulating liners on both sidewalls of a lower portion of the conductive line that contacts with the active regions; spacers that are apart from the insulating liners in a direction perpendicular to a surface of the substrate and sequentially formed on both sidewalls of an upper portion of the conductive line; a blocking layer arranged at a spacing between a spacer located in the middle of the spacers and the insulating liners and in a recess portion recessed from one end of the spacer located in the middle of the spacers toward the conductive line; and conductive patterns arranged on the active regions on both sides of the spacers.

20 Claims, 28 Drawing Sheets

(56) References Cited

U.S. PATENT DOCUMENTS

| | | |
|---|---|---|
| 9,520,348 B2 | 12/2016 | Choi et al. |
| 9,620,451 B2 | 4/2017 | Hwang et al. |
| 9,627,253 B2 | 4/2017 | Kim |
| 9,837,490 B2 | 12/2017 | Park et al. |
| 2014/0159194 A1* | 6/2014 | Song ................. H01L 27/10855 257/522 |
| 2015/0262625 A1* | 9/2015 | Han ..................... H01L 21/764 257/773 |
| 2015/0340281 A1* | 11/2015 | Lee ..................... H01L 21/764 438/5 |
| 2016/0027727 A1* | 1/2016 | Kim ..................... H01L 21/764 257/774 |
| 2017/0005099 A1* | 1/2017 | Lee ................. H01L 21/823481 |
| 2018/0012894 A1* | 1/2018 | Kim ................. H01L 27/10814 |
| 2018/0040560 A1* | 2/2018 | Kim ..................... H01L 21/764 |
| 2018/0040561 A1* | 2/2018 | Kim ................... H01L 23/5226 |
| 2019/0123051 A1* | 4/2019 | Park ................. H01L 27/10885 |

* cited by examiner

SEMICONDUCTOR DEVICE FOR IMPROVING DEVICE CHARACTERISTICS

CROSS-REFERENCE TO RELATED APPLICATION

This application claims the benefit of Korean Patent Application No. 10-2018-0088153, filed on Jul. 27, 2018, in the Korean Intellectual Property Office, the disclosure of which is incorporated herein in its entirety by reference.

BACKGROUND

The inventive concepts relate to a semiconductor device, and more particularly, to a semiconductor device for improving device characteristics.

A highly integrated semiconductor device has poor device characteristics due to difficulties in a manufacturing process. For example, a highly integrated semiconductor device may have a reduced distance between conductive lines (e.g., wiring lines) and a contact pattern located between the conductive lines so that the conductive lines and the contact pattern may short circuit each other. In addition, when capacitance between the conductive lines and the contact pattern with the reduced distance is increased, the operating speed of the semiconductor device may be slower or device characteristics thereof, such as refreshing characteristics, may deteriorate.

SUMMARY

The inventive concepts provide a semiconductor device capable of improving device characteristics without being short-circuited even when a distance between a conductive line and a contact pattern is reduced.

According to an aspect of the inventive concepts, there is provided a semiconductor device including: a substrate having a plurality of active regions defined by a device isolation region; a conductive line extending in a direction on the active regions of the substrate; a plurality of insulating liners on both sidewalls of a lower portion of the conductive line that is in contact with the active regions; a plurality of spacers apart from the insulating liners in a direction perpendicular to a surface of the substrate and sequentially on both sidewalls of an upper portion of the conductive line; a blocking layer between a spacer in the middle of the spacers and the insulating liners and in a recess portion recessed from one end of the spacer located in the middle of the spacers toward the conductive line; and conductive patterns on the active regions on both sides of the spacers.

According to another aspect of the inventive concepts, there is provided a semiconductor device including: a substrate having a plurality of active regions defined by a device isolation region; an interlayer insulating layer on the device isolation region; a conductive line extending in a direction on the interlayer insulating layer of the substrate; a plurality of spacers apart from the interlayer insulating layer in a direction perpendicular to a surface of the substrate and on both sidewalls of the conductive line; a blocking layer at a spacing between a spacer in the middle of the spacers and the interlayer insulating layer and in a recess portion recessed from one end of the spacer located in the middle of the spacers toward the conductive line; and conductive patterns on the active regions on both sides of the spacers.

According to another aspect of the inventive concepts, there is provided a semiconductor device including: a substrate having a plurality of active regions defined by a device isolation region; an interlayer insulating layer on the device isolation region; a conductive line extending in a direction on the active regions of the substrate and the interlayer insulating layer; a plurality of insulating liners on both sidewalls of a lower portion of the conductive line that is in contact with the active regions; a plurality of spacers apart from the insulating liners and the interlayer insulating layer in a direction perpendicular to a surface of the substrate and sequentially formed on both sidewalls of an upper portion of the conductive line; a blocking layer between a spacer in the middle of the spacers and the insulating liners and the interlayer insulating layer and in a recess portion recessed from one end of the spacer located in the middle of the spacers toward the conductive line; and conductive patterns on the active regions on both sides of the spacers.

BRIEF DESCRIPTION OF THE DRAWINGS

At least one embodiment of the inventive concepts will be more clearly understood from the following detailed description taken in conjunction with the accompanying drawings in which.

DETAILED DESCRIPTION OF EMBODIMENTS

Figure 1:
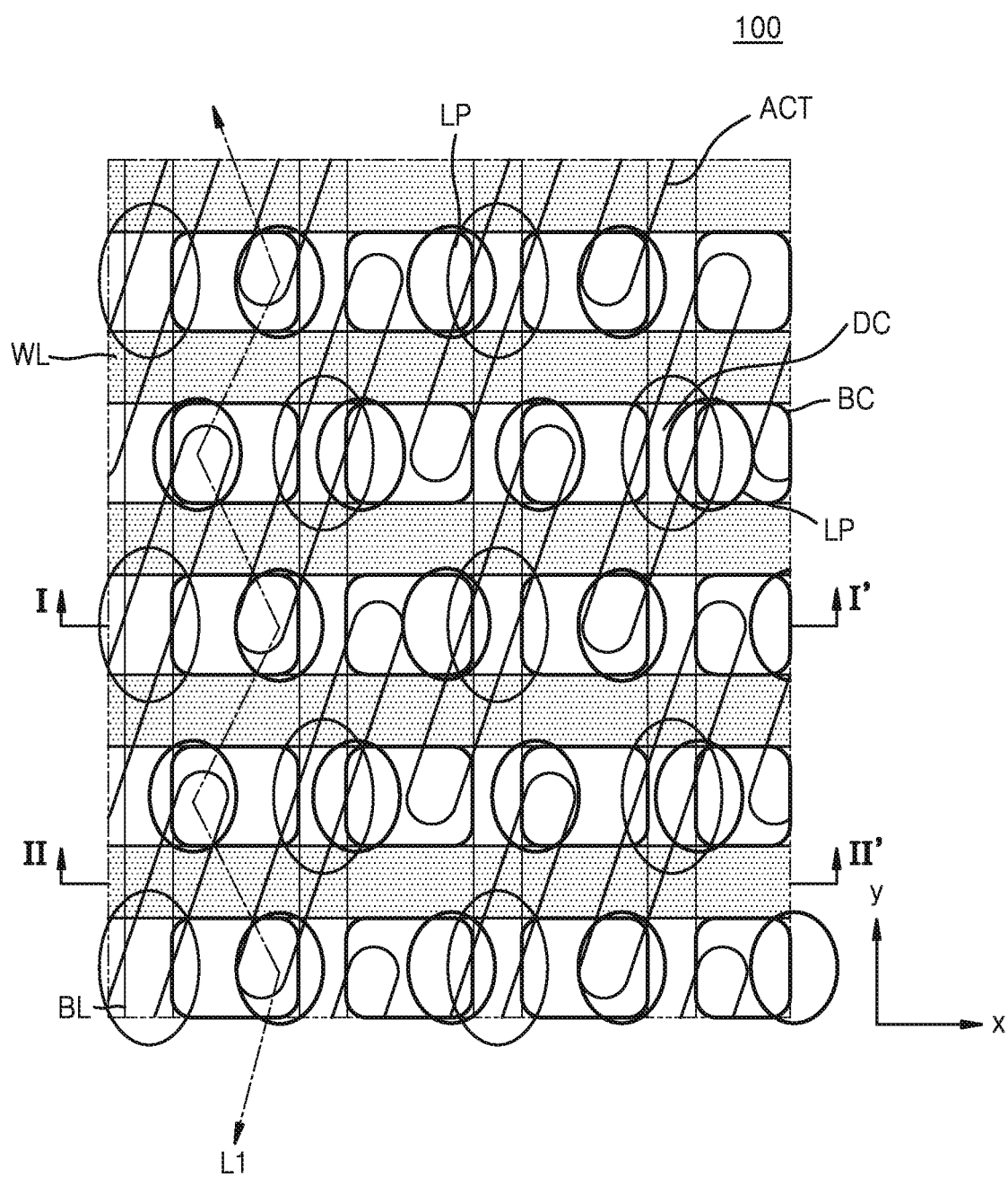
FIG. 1 is a layout view of a semiconductor device according to at least one embodiment of the inventive concepts.

FIG. 1 is a layout view of a semiconductor device according to at least one embodiment of the inventive concepts.

In more detail, a semiconductor device 100 according to at least one embodiment may include a plurality of active regions ACT. An active region ACT may be defined through a device isolation region 114 (of FIG. 2 and the like) formed in a substrate 110 (of FIG. 2 and the like). As a design rule of the semiconductor device 100 decreases, the active region ACT may be arranged in the form of a diagonal line or an oblique line bar as illustrated in the drawings.

A plurality of word lines WL (or gate lines) extending in parallel to each other in a second direction (x direction) across the active region ACT may be arranged on the active region ACT. The word lines WL may be conductive lines. The word lines WL may be arranged at regular intervals. Widths of the word lines WL or intervals between the word lines WL may be determined according to the design rule. A plurality of bit lines BL extending in parallel to each other in a first direction (y direction) orthogonal to the word lines WL are formed on the word lines WL. The bit lines BL may be conductive lines. The bit lines BL may also be arranged at regular intervals. Widths of the bit lines BL or intervals between the bit lines BL may be determined according to the design rule.

In at least one embodiment, the bit lines BL may be arranged parallel to each other with a pitch of 3F. The word lines WL may be arranged parallel to each other with a pitch of 2F each. In this case, F may refer to a minimum lithographic feature size. When the bit lines BL and the word lines WL are arranged with the pitch as described above, the semiconductor device 100 may include a memory cell having a unit cell size of 6F2.

The semiconductor device 100 according to at least one embodiment may include various contact arrangements formed on the active region ACT such as a direct contact DC, a buried contact BC, a landing pad LP, and the like. In at least one embodiment, the direct contact DC may refer to a contact connecting the active region ACT to a bit line BL, and the buried contact BC may refer to a contact connecting the active region ACT to a lower electrode (not shown) of a capacitor.

A contact area between the buried contact BC and the active region ACT may be very small on the arrangement structure. Accordingly, the conductive landing pad LP may be introduced to enlarge a contact area regarding a lower electrode (not shown) of the capacitor and the active region ACT. The landing pad LP may be arranged between the active region ACT and the buried contact BC or may be arranged between the buried contact BC and the lower electrode of the capacitor. In at least one embodiment, the landing pad LP may be arranged between the buried contact BC and the lower electrode of the capacitor. Contact resistance between the active region ACT and the lower electrode of the capacitor may be reduced by increasing the contact areas through the introduction of the landing pad LP.

In the semiconductor device 100 of at least one embodiment, the direct contact DC may be arranged at a center portion of the active region ACT and the buried contact BC may be arranged at both end portions of the active region ACT. The landing pad LP may be arranged to partially overlap the buried contact BC adjacent to the both ends of the active region ACT as the buried contact BC is arranged at the both end portions of the active region ACT.

A word line WL may be formed in a structure in the substrate 110 of the semiconductor device 100 and may be arranged across the active region ACT between the direct contact DC and the buried contact BC. As shown, two word lines WL are arranged to cross one active region ACT and the active region ACT is arranged in an oblique shape to form a certain angle of less than 90° with the word line WL.

The direct contact DC and the buried contact BC may be symmetrically arranged and accordingly may be arranged on a straight line along X and Y axes. The landing pad LP may be arranged in a zigzag shape L1 in the first direction (y direction) in which the bit lines BL extends, unlike the direct contact DC and the buried contact BC. In addition, the landing pad LP may be arranged to overlap the same side surface of each bit line BL in the second direction (x direction) in which the word line WL extends. For example, each of the landing pads LP of a first line may overlap a left side surface of a corresponding bit line BL, and each of the landing pads LP of a second line may overlap a right side surface of a corresponding bit line BL.

Figure 2:
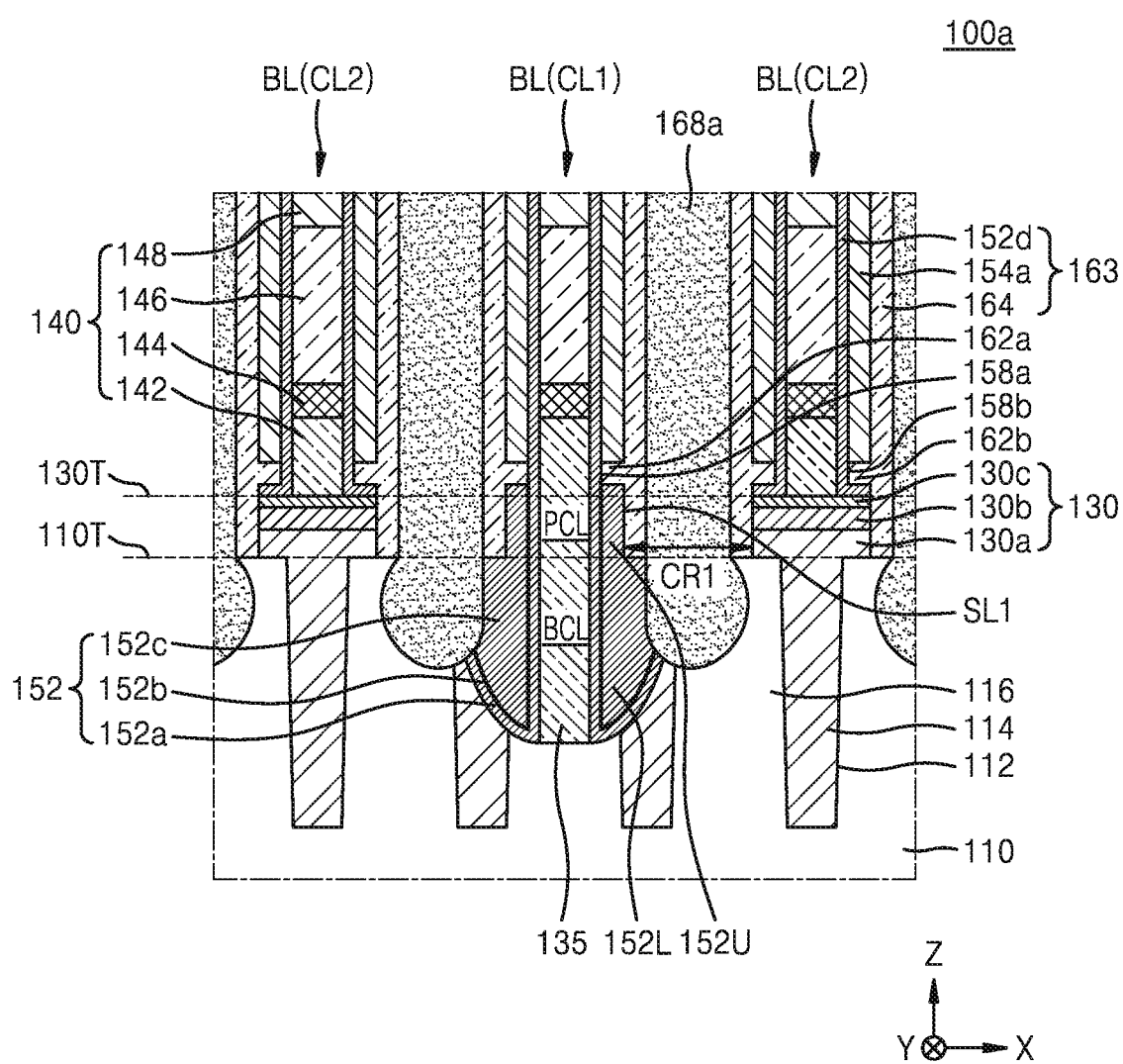
FIG. 2 is a cross-sectional view of a main part of a semiconductor device according to at least one embodiment of the inventive concepts.

FIG. 2 is a cross-sectional view of a main part of a semiconductor device according to at least one embodiment of the inventive concepts.

In more detail, a semiconductor device 100a of FIG. 2 may be a partial cross-sectional view taken along line I-I' of FIG. 1. The semiconductor device 100a may include a substrate 110 having a plurality of active regions 116 defined by a device isolation region 114. The device isolation region 114 may include a device isolation layer in a device isolation trench 112 formed in the substrate 110.

The device isolation region 114 may further include a bit line BL 140 extending in a first direction (y direction) of the substrate 110. The bit line BL 140 may include multiple layers as shown. For example, the bit line BL 140 may be formed by sequentially stacking impurity-doped polysilicon 142, tungsten nitride 144, tungsten 146, and a capping insulating layer 148. The capping insulating layer 148 may include a silicon nitride layer. The bit line BL 140 may include only the polysilicon 142, tungsten nitride 144, and tungsten 146 that are narrowly doped.

In at least one embodiment, the bit lines BL may be formed as a single layer, unlike the drawings. For example, the bit line BL 140 may include at least one of impurity-doped semiconductor, metal, metal nitride, and metal silicide.

The bit line BL 140 may include a first conductive line CL1 and a second conductive line CL2. The first conductive line CL1 may be formed on an active region 116 of the substrate 110. The second conductive line CL2 may be formed on an interlayer insulating layer 130 on the device isolation region 114 formed in the substrate 110.

The interlayer insulating layer 130 may include a plurality of insulating layers, for example, first to third insulating layers 130a, 130b, and/or 130c formed on the device isolation regions 114. The first insulating layer 130a, the second insulating layer 130b, and/or the third insulating layer 130c may include a silicon oxide layer, a silicon nitride layer, and a silicon oxide layer, respectively.

The first conductive line CL1 may include a direct contact 135 that is in contact with the active region 116. The direct contact 135 may include impurity-doped polysilicon as described above. A plurality of insulating liners 152 are formed on a lower portion of the first conductive line CL1 that is in contact with the active region 116, e.g., on both sidewalls of the direct contact 135.

The insulating liners 152 may be formed to protect the lower portion of the first conductive line CL1. The insulating liners 152 may be formed to insulate the lower portion of the first conductive line CL1 from conductive patterns 168a, that is, the buried contact BC. The insulating liners 152 may include a first insulating liner 152a, a second insulating liner 152b, and a third insulating liner 152c that are sequentially formed from one sidewall of the first conductive line CL1, that is, the direct contact 135. The first insulating liner 152a, the second insulating liner 152b, and/or the third insulating liner 152c may include a silicon nitride layer, a silicon oxide layer, and a silicon nitride layer, respectively.

The first conductive line CL1, that is, the direct contact 135 may include a protruded conductive line PCL protruding from a surface 110T of the substrate 110 and/or a buried conductive line BCL formed below the surface 110T of the substrate 110. Upper insulating liners 152U being higher than the surface 110T of the substrate 110 are formed on both sides of the protruded conductive line PCL. Lower insulating liners 152L being lower than the surface 110T of the substrate 110 are formed on both sides of the buried conductive line BCL.

A sidewall SL1 of the upper insulating liners 152U on the side of conductive patterns 168a may be perpendicular to the surface 110T of the substrate 110. When the sidewall SL1 of the upper insulating liners 152U are vertical, a lower opening length CR1 of the conductive patterns 168a, that is, the buried contact BC may be extended when the semiconductor device 100a is manufactured, and thus, device characteristics, for example, contact resistance may be lowered.

A plurality of spacers 163 are formed on both sidewalls of upper portions of the first conductive line CL1 and the second conductive line CL2. The spacers 163 may be referred to as multiple spacers. Each of the spacers 163 may include an internal spacer 152d formed on one sidewall of the first conductive line CL1 and the second conductive line CL2 and a first external spacer 154a and a second external spacer 164 that are sequentially formed on one sidewall of the internal spacer 152d.

The internal spacer 152d may include a silicon nitride layer. The first external spacer 154a may include a silicon oxide layer. The second external spacer 164 may include a silicon nitride layer. When the first external spacer 154a is removed by etching, the first external spacer 154a may be an air spacer. At least one embodiment describes two external spacers, that is, the first and second external spacers 154a and 164, but a greater number of external spacers may be included.

The conductive patterns 168a, that is, the buried contact BC is formed on the active regions 116 on both sides of the spacers 163. The spacers 163 formed on both sidewalls of the first conductive line CL1 are spaced apart from the insulating liners 152 in a direction perpendicular to the surface 110T of the substrate 110.

Thus, a first blocking layer 162a is arranged at a spacing between the first external spacer 154a located in the middle of the spacers 163 and the insulating liners 152 and in a first recess portion 158a recessed from one end of the first external spacer 154a toward the first conductive line CL1.

The first blocking layer 162a extends from the first external spacer 154a toward the first conductive line CL1. The first blocking layer 162a in the first recess portion 158a may have a rectangular cross-sectional shape toward the first conductive line CL1. In at least one embodiment, the first blocking layer 162a in the first recess portion 158a may have a round cross-sectional shape toward the first conductive line CL1. The present application is not limited to a cross-sectional shape of the first blocking layer 162a in the first recess portion 158a. The first blocking layer 162a is formed below the first external spacer 154a. The first blocking layer 162a may include a silicon nitride layer.

The first blocking layer 162a may protect the insulating liners 152 when the first blocking layer 162a is formed as an air spacer by removing the first external spacer 154a. In addition, when the first external spacer 154a is formed as an air spacer, the first blocking layer 162a may suppress the effect of etching gas penetrating through the air spacer, for example, Cl gas, on the active region 116 through the insulating liners 152. Thus, device characteristics, such as refreshing characteristics, may be improved.

The spacers 163 formed on both sidewalls of the second conductive line CL2 are spaced apart from the interlayer insulating layer 130 in a direction perpendicular to the surface 110T of the substrate 110. A second blocking layer 162b is arranged at a spacing between a spacer located in the middle of the spacers and the interlayer insulating layer 130 and in a second recess portion 158b recessed from one end of the first external spacer 154a toward the second conductive line CL2.

The second blocking layer 162b extends from the first external spacer 154a toward the second conductive line CL2. Internal spacers 152d formed on both sidewalls of the second conductive line CL2 among the spacers 163 are also formed on a surface 130T of the interlayer insulating layer 130. The second blocking layer 162b in the second recess portion 158b may have a rectangular cross-sectional shape toward the second conductive line CL2.

In at least one embodiment, the second blocking layer 162b in the second recess portion 158b may have a round cross-sectional shape toward the second conductive line CL2. The present application is not limited to a cross-sectional shape of the second blocking layer 162b in the second recess portion 158b. The second blocking layer 162b is formed on the surface 130T of the interlayer insulating layer 130. The second blocking layer 162b includes the same material as that of the first blocking layer 162a.

The second blocking layer 162b may protect the lower interlayer insulating layer 130 when the second blocking layer 162b is formed as an air spacer by removing the first external spacer 154a. In addition, when the first external spacer 154a is formed as an air spacer, the second blocking layer 162b may suppress the effect of etching gas penetrating through the air spacer, for example, Cl gas, on the active region 116 through the insulating liner 152. Thus, device characteristics, such as refreshing characteristics, may be improved.

An outermost spacer among the plurality of spacers 163, that is, the second external spacer 164, extends in a vertical direction of the substrate 110 between the insulating liners 152 and the conductive patterns 168a. The second external spacer 164 formed on both sidewalls of the first conductive line CL1 and the second conductive line CL2 may include the same material as that of the first blocking layer 162a and the second blocking layer 162b.

Figure 3:
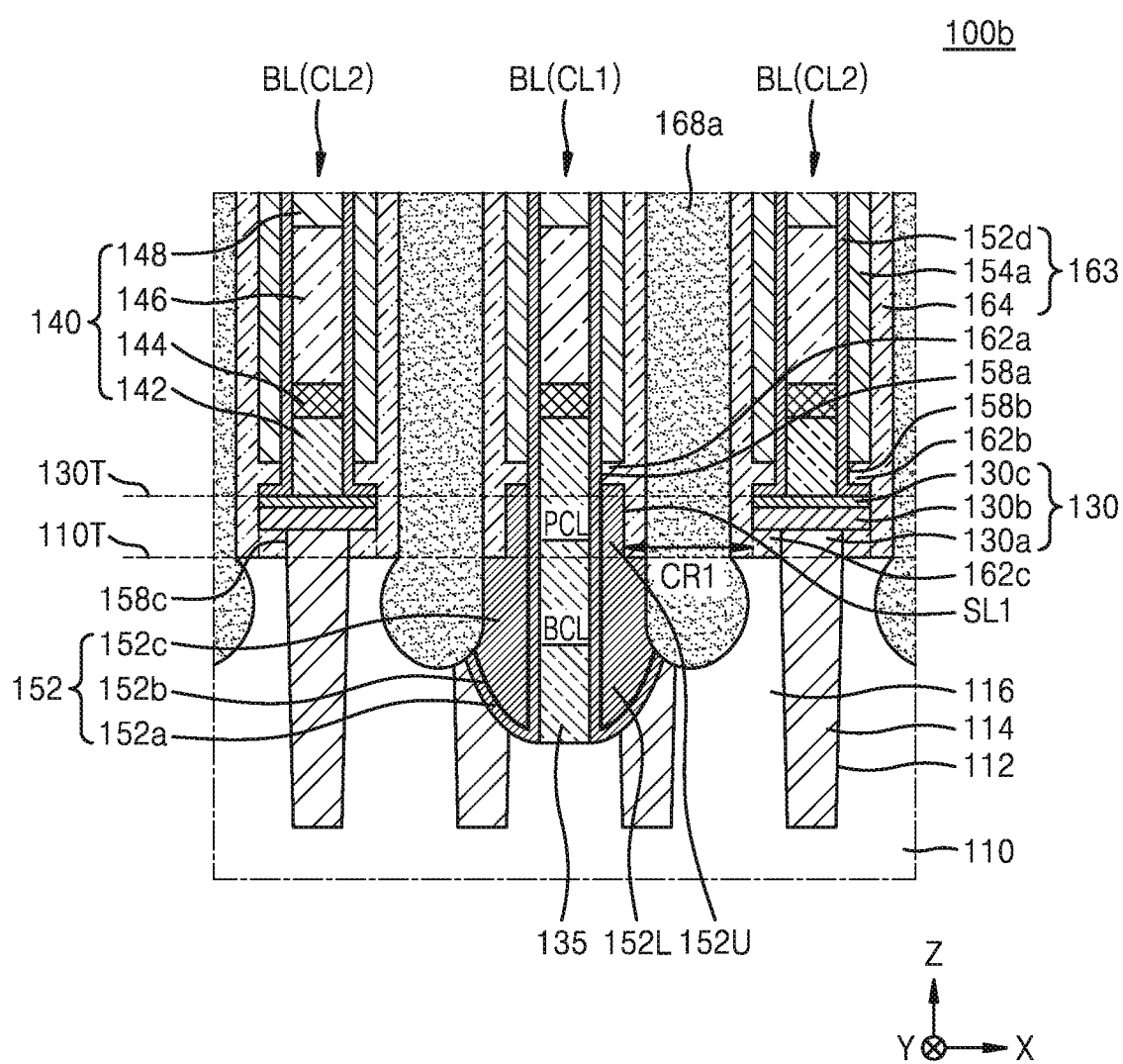
FIG. 3 is a cross-sectional view of a main part of a semiconductor device according to at least one embodiment of the inventive concepts.

FIG. 3 is a cross-sectional view of a main part of a semiconductor device according to at least one embodiment of the inventive concepts.

In at least one embodiment, a semiconductor device 100b of FIG. 3 may be a partial cross-sectional view taken along line I-I' of FIG. 1. The semiconductor device 100b is formed with an additional recess portion 158c formed below the interlayer insulating layer 130 inwardly and an additional blocking layer 162c is formed the additional recess portion 158c as compared with the semiconductor device 100a of FIG. 2. In FIG. 3, the same reference numerals as in FIG. 2 denote the same elements, and further descriptions thereof will be omitted or simplified for convenience.

The semiconductor device 100b includes the interlayer insulating layer 130 formed on the device isolation region 114 on a substrate 110. The additional recess portion 158c is formed below the interlayer insulating layer 130 inwardly. That is, a width of the first insulating layer 130a is less than those of the second and third insulating layers 130b and 130c. The additional blocking layer 162c is formed in the additional recess portion 158c. The second blocking layer 162b and the additional blocking layer 162c include the same material as that of an outermost external spacer among the spacers 163.

The semiconductor device 100b further includes the additional blocking layer 162c and may further suppress the effect of etching gas penetrating through the air spacer, for example, Cl gas, on the active region 116 through the insulating liner 152. Thus, device characteristics, such as refreshing characteristics, may further be improved.

FIGS. 4 to 14 are cross-sectional views of a main part of a semiconductor device for explaining a method of manufacturing the semiconductor device, according to at least one embodiment of the inventive concepts.

Figure 4A:
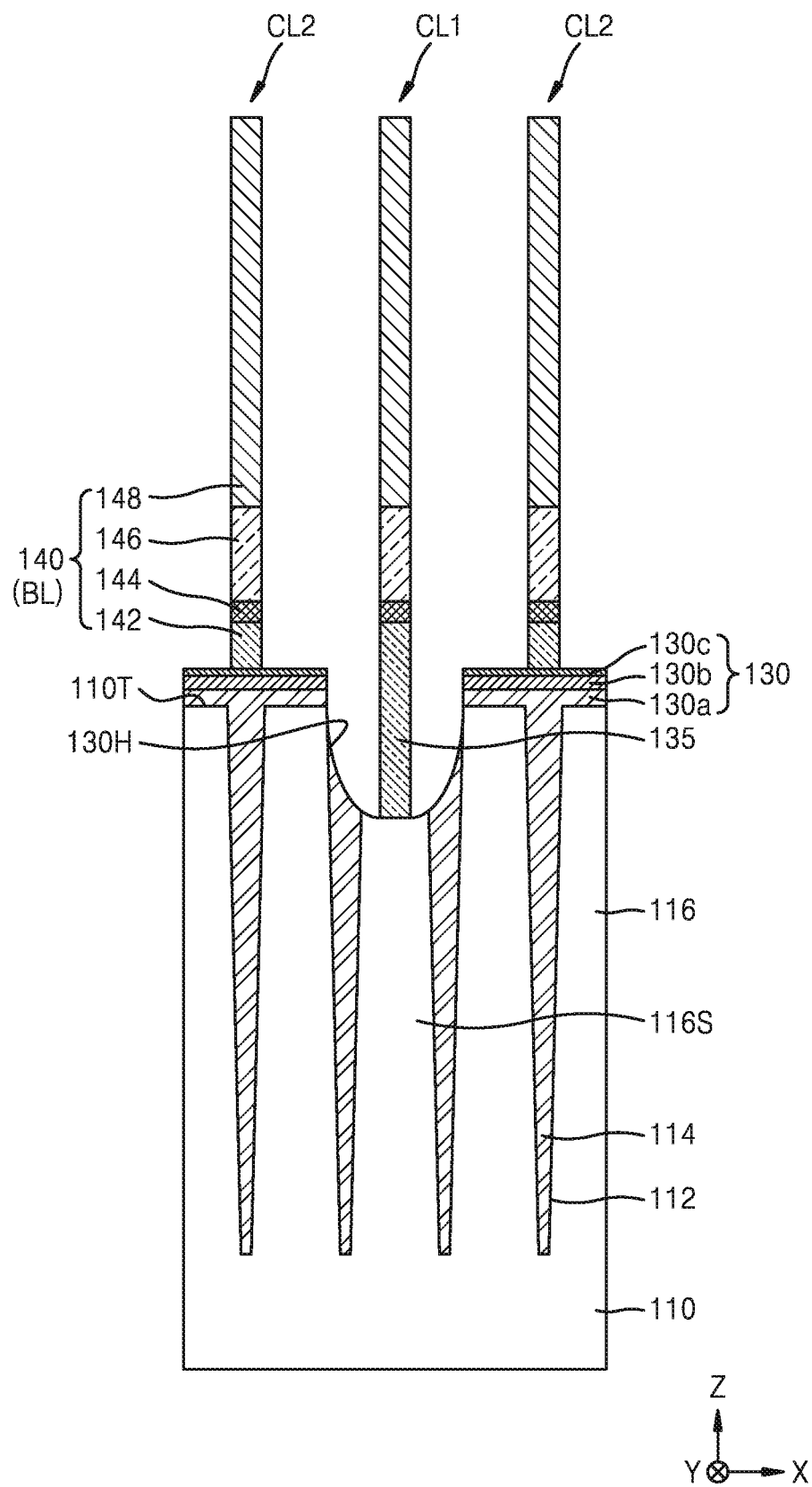
FIGS. 4A to 14 are cross-sectional views of a main part of a semiconductor device for explaining a method of manufacturing the semiconductor device, according to at least one embodiment of the inventive concepts.
Figure 4B:
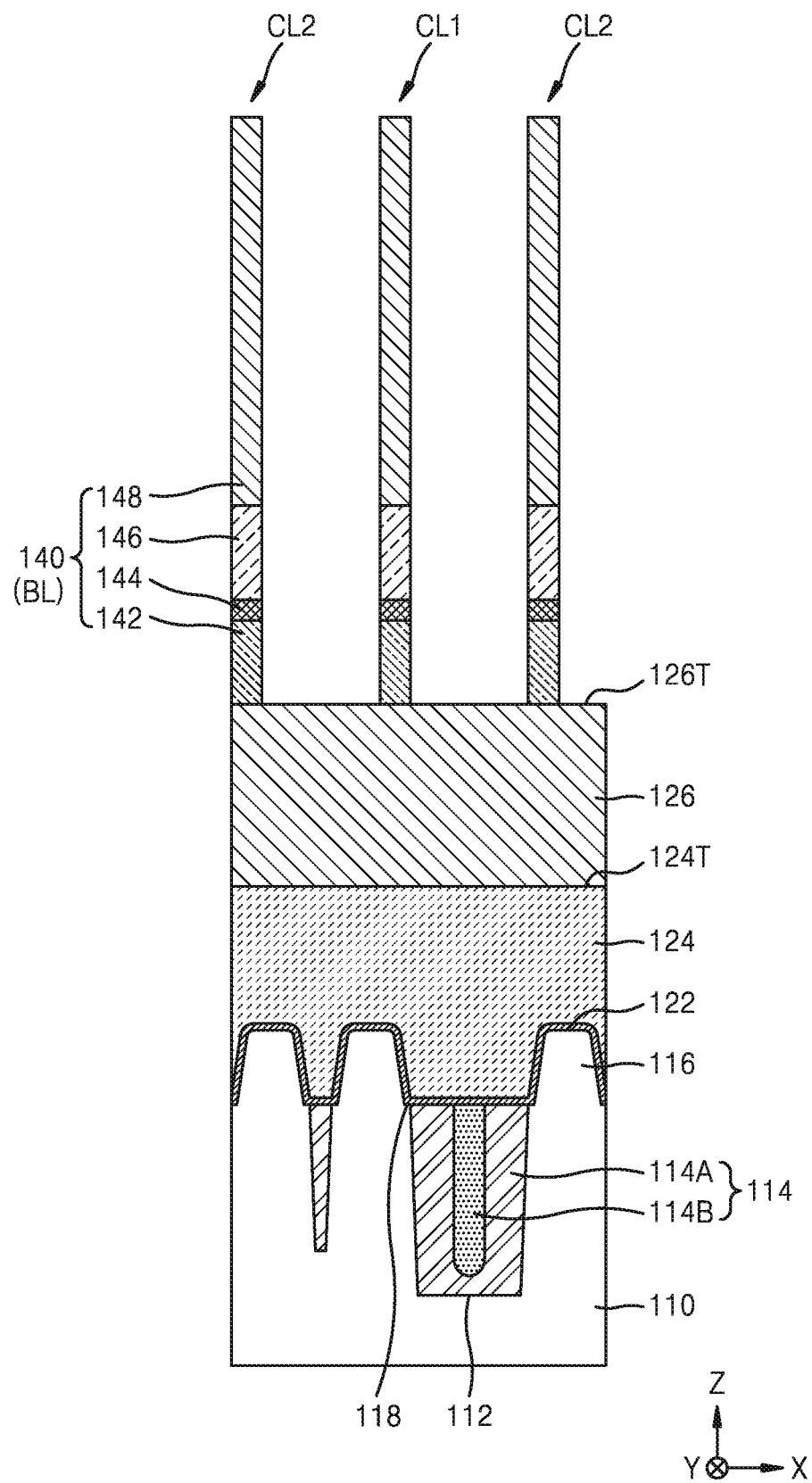

In more detail, FIG. 4A, FIGS. 5 to 8, FIGS. 9A and 9B, FIGS. 10A and 10B, and FIGS. 11 to 14 may be cross-sectional views of a main part of the semiconductor device taken along line I-I' of FIG. 1, and FIG. 4B may be a cross-sectional view of a main part of the semiconductor device taken along line II-II of FIG. 1. In FIGS. 4 to 14, the same reference numerals as in FIGS. 2 and 3 denote the same elements, and therefore, detailed descriptions thereof will not be given herein.

Referring to FIGS. 4A and 4B, the device isolation trench 112 is formed in the substrate 110, and the device isolation region 114 is then formed by filling an insulating layer in the device isolation trench 112. The active region 116 may be defined in the substrate 110 by the device isolation region 114. The active region 116, as shown in FIG. 1, may have a relatively long island shape having a short axis and a long axis, and may be arranged in an oblique shape to form an angle of less than 90° with a word line 124 which is formed above the active region 116.

The substrate 110 may include silicon (Si), for example, crystalline Si, polycrystalline Si, or amorphous Si. In at least one embodiment, the substrate 110 may include germanium (Ge) or a compound semiconductor such as SiGe, silicon carbide (SiC), gallium arsenide (GaAs), indium arsenide (InAs), or indium phosphide (InP). In at least one embodiment, the substrate 110 may include a conductive region, such as an impurity-doped well or an impurity-doped structure.

The device isolation region 114 may be formed as a single insulating layer, but may include an outer insulating layer 114A and an inner insulating layer 114B as shown in FIG. 4B. The outer insulating layer 114A and the inner insulating layer 114B may include different materials. For example, the outer insulating layer 114A may include an oxide layer, and the inner insulating layer 114B may include a nitride film. However, a configuration of the device isolation region 114 is not limited thereto. For example, the device isolation region 114 may have a multilayer structure including a combination of at least three kinds of insulating films.

A plurality of word line trenches 118 are formed in the substrate 110. The word line trenches 118 extend parallel to each other and may each have a line shape across the active region 116. As shown in FIG. 4B, the device isolation region 114 and the substrate 110 are etched by performing separate etching processes to form the word line trenches 118 each having a lower surface in a step form, and thus an etching depth of the device isolation region 114 may be different from that of the substrate 110.

A gate dielectric layer 122, a word line 124, and a buried insulating layer 126 are sequentially formed in each of the word line trenches 118. In at least one embodiment, after the word line 124 is formed, impurity ions may be implanted into the substrate 110 on both sides of the word line 120 using the word line 124 as a mask to form source/drain regions on the active region 116.

A source region 116S is shown in FIG. 4A. The direct contact DC may be connected to the source region 116S. In at least one embodiment, an impurity ion implantation process may be performed to form the source/drain regions prior to forming the word line 124.

A surface 124T of the word line 124 may be lower than the surface 110T of the substrate 110. A lower surface of the word line 124 may have an uneven shape, and a saddle-finned transistor (saddle FinFET) may be formed in the active region 116. In at least one embodiment, the word line 124 may include at least one of titanium (Ti), titanium nitride (TiN), tantalum (Ta), tantalum nitride (TaN), tungsten (W), tungsten nitride (WN), titanium silicide nitride (TiSiN), and tungsten silicide nitride (WSiN).

The gate dielectric layer 122 may include at least one of a silicon oxide layer, a silicon nitride layer, a silicon oxynitride layer, an oxide/nitride/oxide (ONO) layer, and a high-k dielectric layer having a dielectric constant higher than that of the silicon oxide layer. For example, the gate dielectric layer 122 may have a dielectric constant of about 10 to 25.

In at least one embodiment, the gate dielectric layer 122 may include at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). Furthermore, the gate dielectric layer 122 may include hafnium oxide ($HfO_2$), aluminum oxide ($Al_2O_3$), hafnium aluminum oxide ($HfAlO_3$), tantalum oxide ($Ta_2O_3$), or titanium oxide ($TiO_2$).

A surface 126T of the buried insulating layer 126 may be located at approximately the same level as the surface 110T (upper surface) of the substrate 110. The buried insulating layer 126 may include a silicon oxide layer, a silicon nitride layer, a silicon oxynitride layer, or a combination thereof.

The interlayer insulating layer 130 is formed in the substrate 110 as shown in FIG. 4. The interlayer insulating layer 130 may include the first insulating layer 130a, the second insulating layer 130b, and the third insulating layer 130c. The interlayer insulating layer 130 may include a single insulating layer as needed. The interlayer insulating layer 130 may include a contact hole 130H exposing the source region 116S in the active region 116.

The bit line BL 140 is formed on the interlayer insulating layer 130, the contact hole 130H, and the buried insulating layer 126. The bit line BL 140 may extend in the first direction (y direction in FIG. 1). For example, the bit line BL 140 may be formed by sequentially stacking the impurity-doped polysilicon 142, the tungsten nitride 144, the tungsten 146, and the capping insulating layer 148. The impurity-doped polysilicon 142 formed in the contact hole 130H in the bit line BL 140 may constitute the direct contact 135 electrically connected to the source region 116S.

The bit line BL 140 may include the first conductive line CL1 and the second conductive line CL2. The first conductive line CL1 may be formed on the active region 116 of the substrate 110 or on the buried insulating layer 126. The second conductive line CL2 may be formed on the interlayer insulating layer 130 on the substrate 110 or on the buried insulating layer 126.

Figure 5:
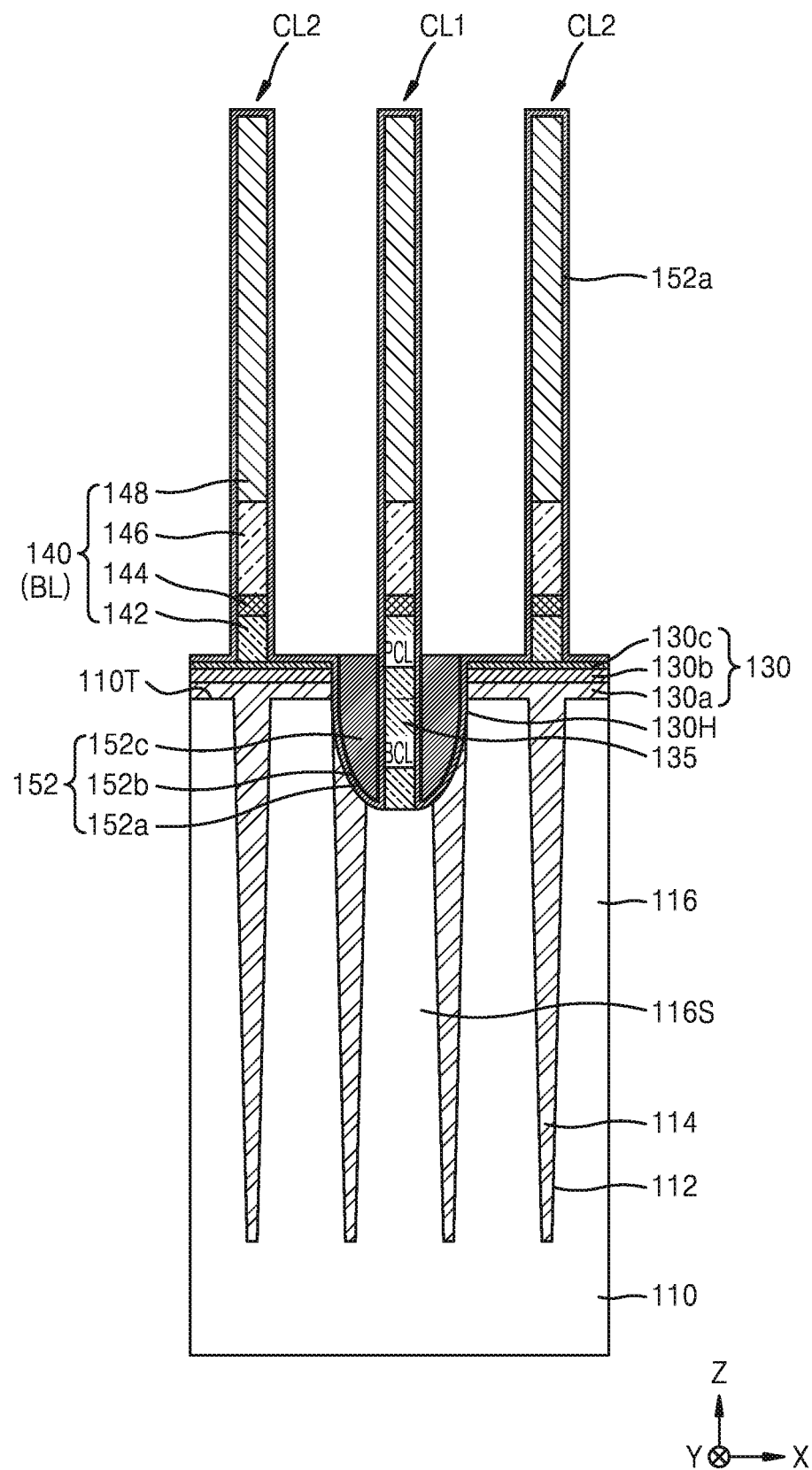

Referring to FIG. 5, the first insulating liner 152a is formed on sidewalls and surface of the bit line BL 140. The first insulating liner 152a formed on the sidewalls and surface of the bit line BL 140 may be an internal spacer through a subsequent process. In addition, the insulating liners 152 are formed in the contact hole 130H exposing the source region 116S of the active region 116.

The insulating liners 152 may include the first insulating liner 152a, the second insulating liner 152b, and/or the third insulating liner 152c that are sequentially formed from one sidewall of the first conductive line CL1, that is, the direct contact 135. The first insulating liner 152a formed on the sidewalls and surface of the bit line BL 140 and the first insulating liner 152a formed in the contact hole 130H may be formed by an identical process.

The insulating liners 152 formed in the contact hole 130H may be formed to protect a lower portion of the first conductive line CL1. The first insulating liner 152a, the second insulating liner 152b, and/or the third insulating liner 152c may include a silicon nitride layer, a silicon oxide layer, and a silicon nitride layer, respectively.

The first conductive line CL1, that is, the direct contact 135, may be divided into the protruded conductive line PCL protruding from the surface 110T of the substrate 110 and the buried conductive line BCL formed below the surface 110T of the substrate 110 due to the insulating liners 152 formed in the contact hole 130H.

Figure 6:
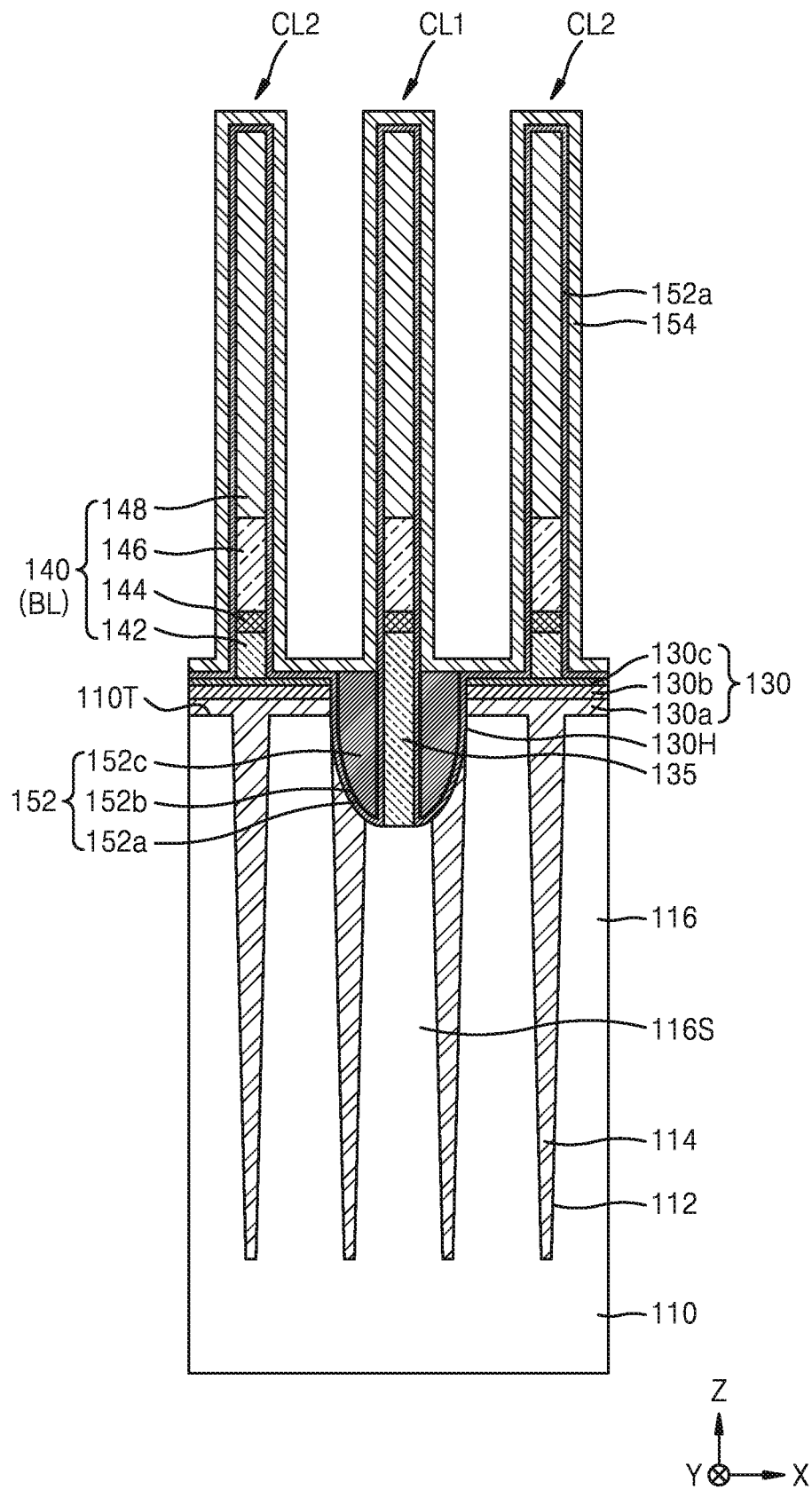
Figure 7:
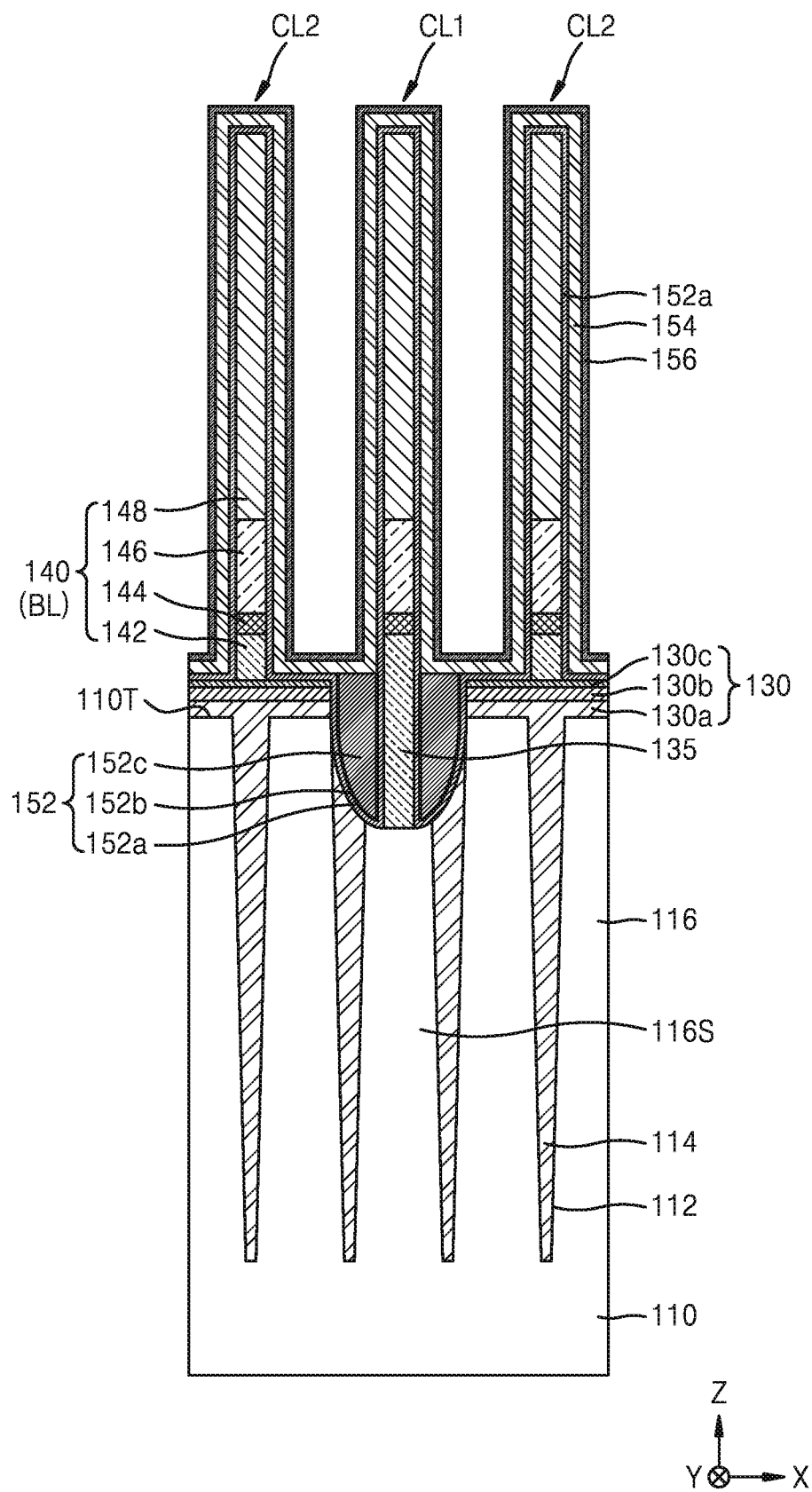

Referring to FIGS. 6 and 7, as shown in FIG. 6, an insulating film 154 for a spacer is formed on a front surface of the first insulating liner 152a formed on the sidewalls and surface of the bit line BL 140 and the substrate 110 in which the insulating liners 152 formed in the contact hole 130H are formed.

The insulating film 154 for a spacer may include a material having an etch selectivity with respect to the first insulating liner 152a formed on the sidewalls and surface of the bit line BL 140 and the first insulating liner 152a formed in the contact hole 130H. The insulating film 154 for a spacer may include a silicon oxide layer. The insulating film 154 for a spacer may be an external spacer or an air spacer through a subsequent manufacturing process.

A material film 156 for a mask is formed on the front surface of the substrate 110 on which the insulating film 154 for a spacer is formed, as shown in FIG. 7. The material film 156 for a mask may be formed on the insulating film 154 for a spacer on the sidewalls and surface of the bit line BL 140. The material film 156 for a mask may include a material having an etch selectivity with respect to the insulating film 154 for a spacer and the first insulating layer 130a. The material film 156 for a mask may include a titanium nitride film (TiN).

Figure 8:
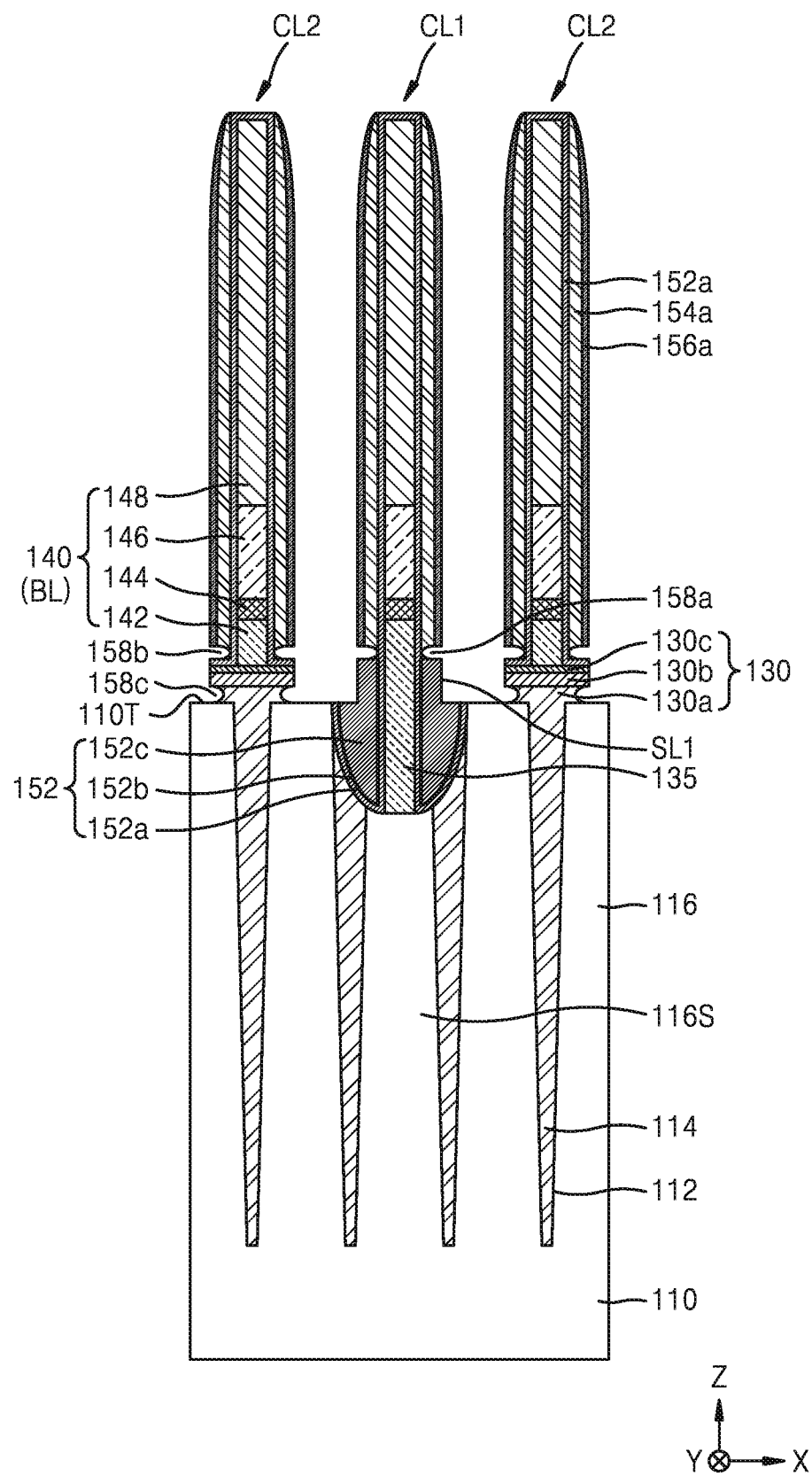
Figure 9A:
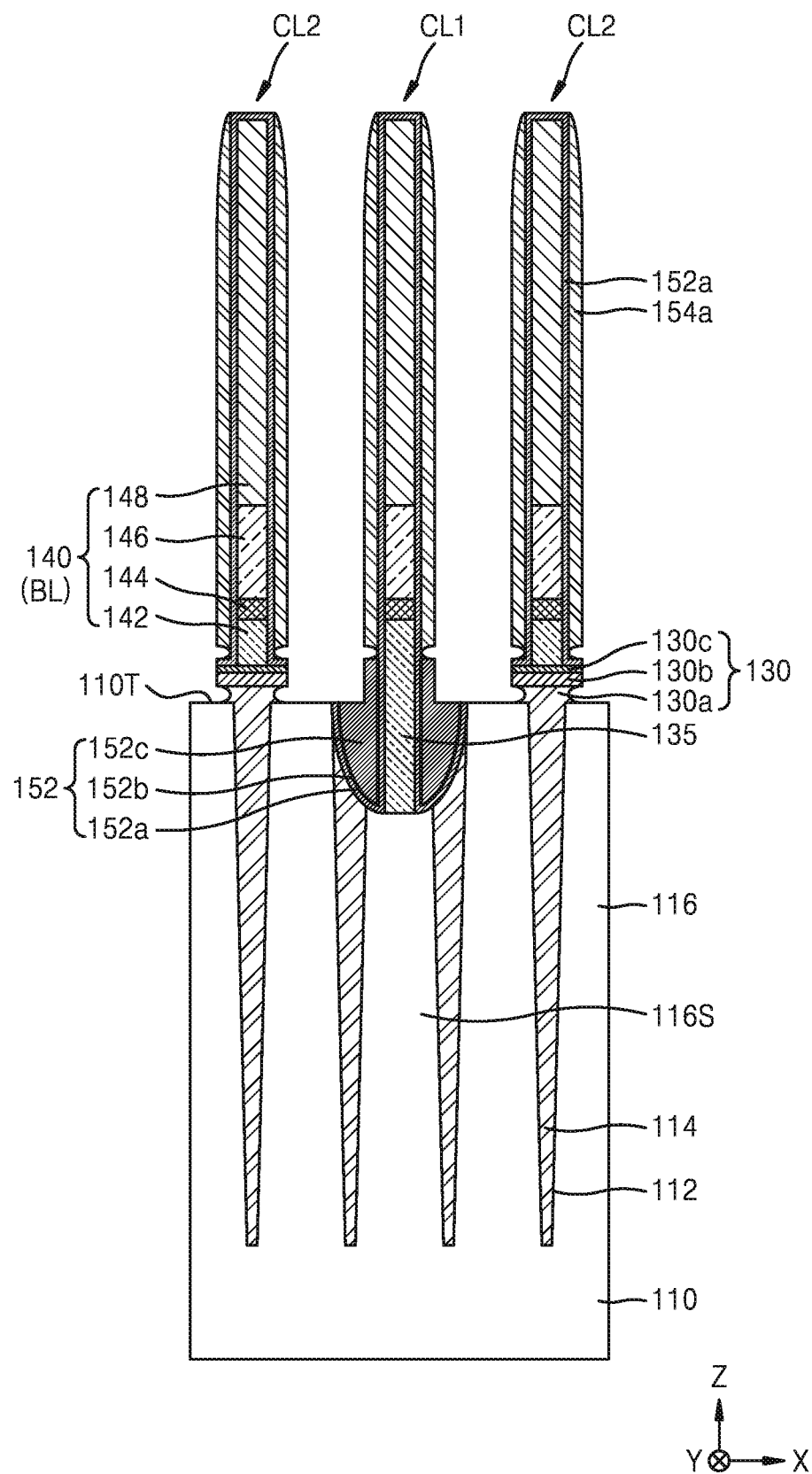
Figure 9B:
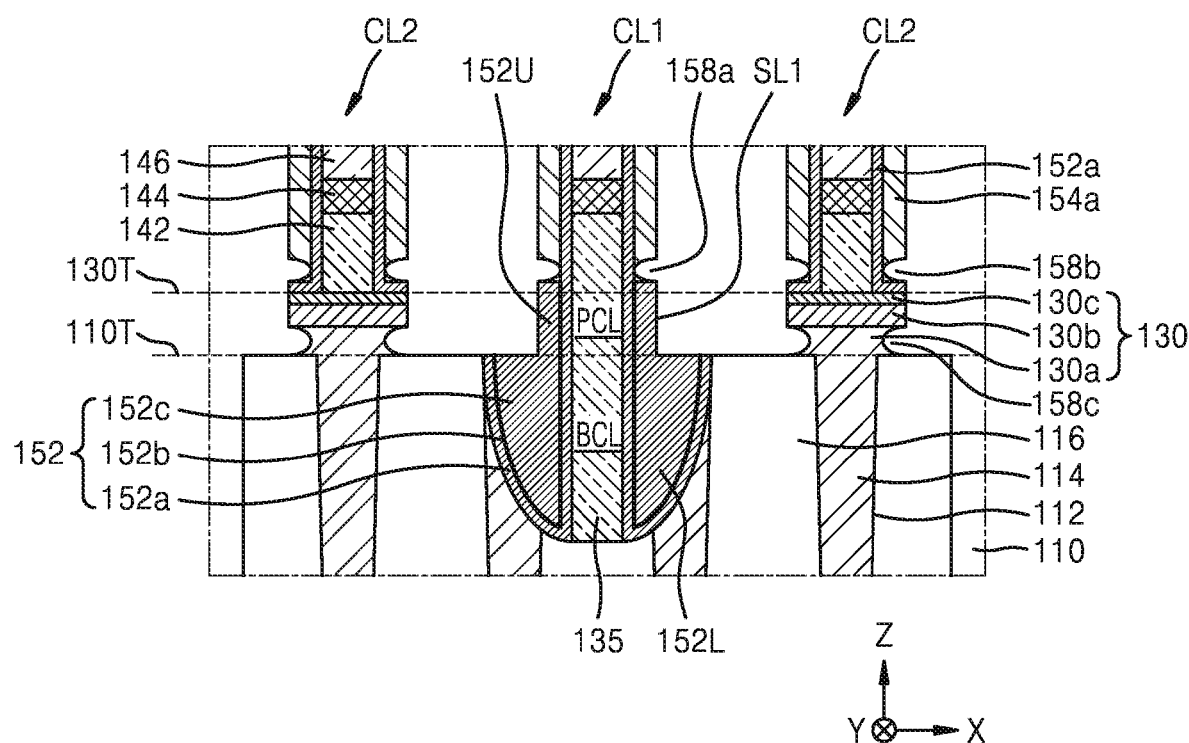

Referring to FIG. 8 and FIGS. 9A and 9B, FIG. 9A shows a state in which a mask spacer 156a of FIG. 8 is removed. FIG. 9B is a partial enlarged view of FIG. 9A.

In more detail, the first insulating liner 152a formed on the bit line BL 140 and the interlayer insulating layer 130 is used as an etch stop film, and the material film 156 (of FIG. 7) for a mask, the insulating film 154 (of FIG. 7) for a spacer, and the third insulating liner 152c are etched back to form the first external spacer 154a and the mask spacer 156a. The first external spacer 154a may be an air spacer as described later below.

When the first external spacer 154a and the mask spacer 156a are formed, the insulating film 154 for a spacer and the material film 156 for a mask on the first insulating liner 152a on the surface of the bit line BL 140 may be removed. When the first external spacer 154a and the mask spacer 156a are formed, the insulating film 154 for a spacer and the material film 156 for a mask on the first insulating liner 152a on the interlayer insulating layer 130 between first to third conductive lines CL1 to CL3 may be removed.

Also, when the first external spacer 154a and the mask spacer 156a are formed, the third insulating liner 152c on the surface 110T of the substrate 110 among the insulating liners 152 may also be etched. Accordingly, as shown in FIG. 9B, the insulating liners 152 may be divided into the upper insulating liners 152U and the lower insulating liners 152L, the upper insulating liners 152U being higher than the surface 110T of the substrate 110 on both sides of the protruded conductive line PCL and the lower insulating liners 152L being lower than the surface 110T of the substrate on both sides of the buried conductive line BCL.

When the first external spacer 154a and the mask spacer 156a are formed, the sidewall SL1 of the upper insulating liners 152U may be perpendicular to the surface 110T of the substrate 110. If necessary, when the third insulating liner 152c is further etched with the mask spacer 156a as an etch mask or the mask spacer 156a is removed, the sidewall SL1 of the upper insulating liners 152U may be perpendicular to the surface 110T of the substrate 110. When the third insulating liner 152c is further etched or the mask spacer 156a is removed, a width of the upper insulating liners 152U may be reduced.

When the sidewall SL1 of the upper insulating liners 152U is vertical, etching of a subsequent insulating film 162 (of FIGS. 10A and 10B) for a spacer may be facilitated and the lower opening length CR1 of the buried contact BC may be extended as described above, and thus, device characteristics, for example, contact resistance may be lowered. In addition, the first external spacer 154a and the mask spacer 156a may be formed on the first insulating liner 152a on the sidewalls of the bit line BL 140 through the preceding manufacturing process.

Subsequently, the first recess portion 158a, the second recess portion 158b, and the additional recess portion 158c are formed by etching a lower portion of the first external spacer 154a and the first insulating layer 130a using the mask spacer 156a as an etch mask. The first recess portion 158a may be a portion where the lower portion of the first external spacer 154a on the upper insulating liners 152U is recessed toward the first conductive line CL1. The second recess portion 158b may be a portion where the lower portion of the first external spacer 154a on the first insulating liner 152a on the interlayer insulating layer 130 is recessed toward the second conductive line CL2. The additional recess portion 158c may be a portion where one sidewall of the first insulating layer 130a in the interlayer insulating layer 130 is recessed toward the second conductive line CL2.

In at least one embodiment, one section of the first recess portion 158a and the second recess portion 158b adjacent to the first insulating liner 152a may be rounded when the first external spacer 154a is wet etched. One section of the additional recess portion 158c formed in the first insulating layer 130a adjacent to the device isolation region 114 may be rounded. The additional recess portion 158c may not be formed as needed.

Figure 10A:
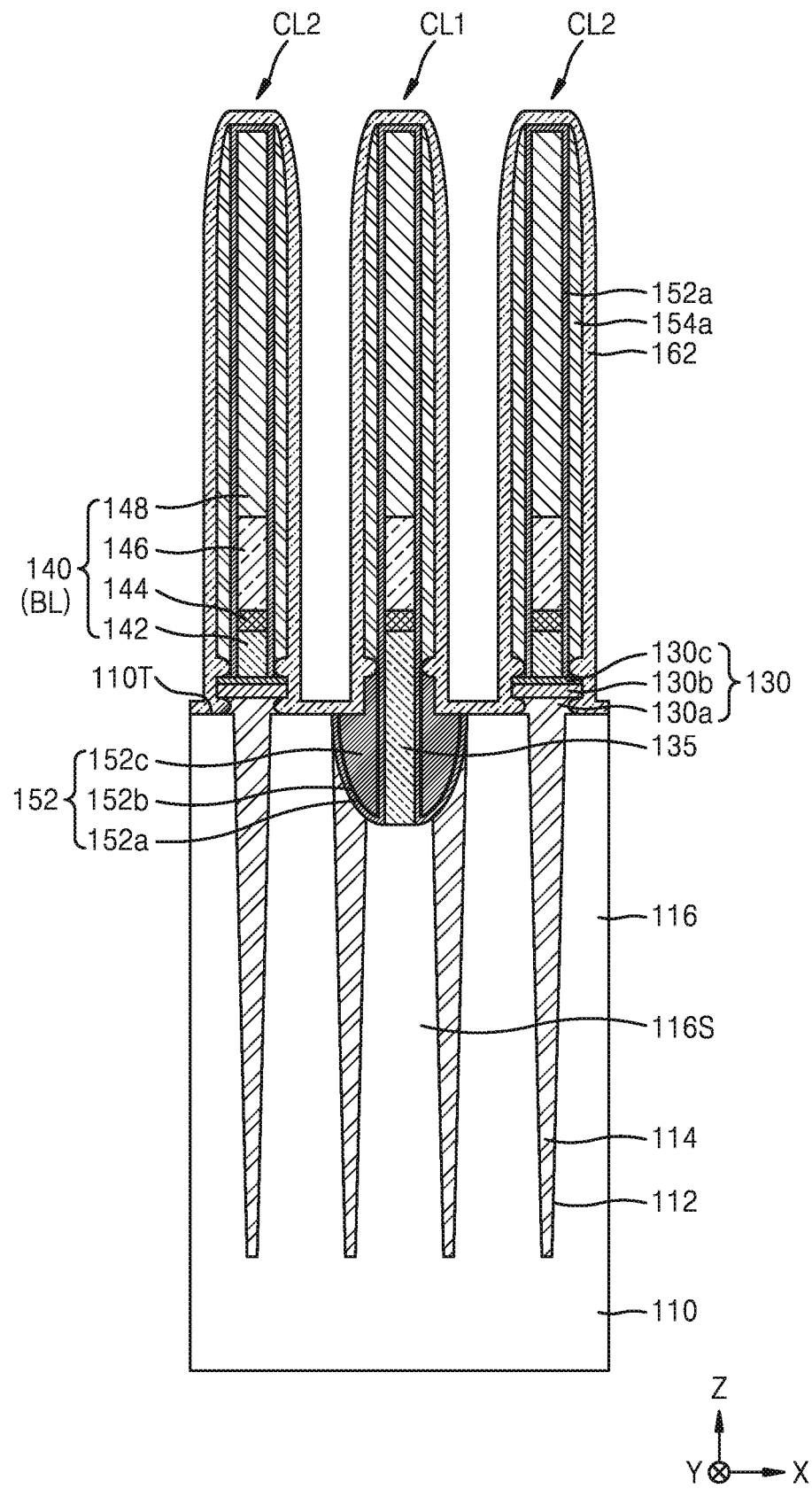
Figure 10B:
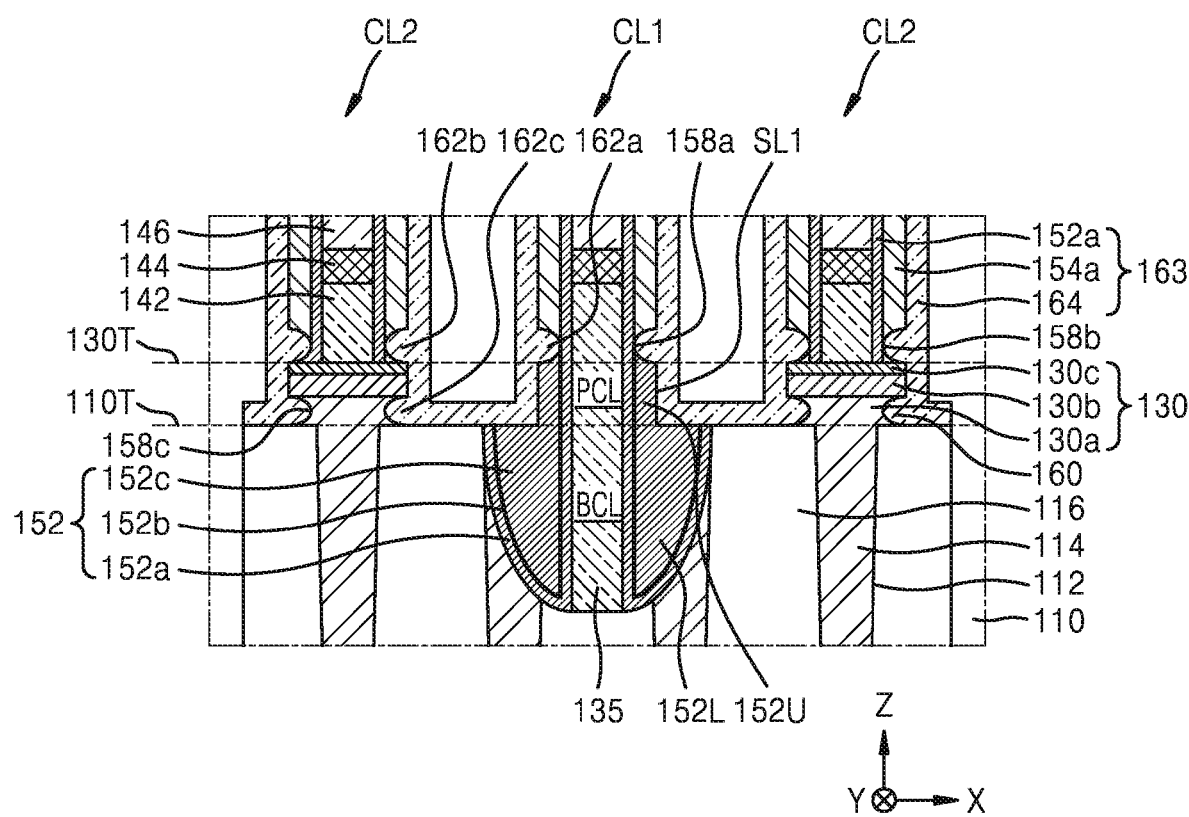

Referring to FIGS. 10A and 10B, the insulating film 162 for a spacer is formed on a front surface of the substrate 110 on which the first external spacer 154a on the sidewalls and surface of the bit line BL 140, the insulating liners 152, and the interlayer insulating layer 130 are formed while the first recess portion 158a, the second recess portion 158b, and the additional recess portion 158c are filled. The insulating film 162 for a spacer may include a silicon nitride layer. The insulating film 154 for a spacer may be an external spacer through a subsequent manufacturing process.

Accordingly, the first blocking layer 162a and the second blocking layer 162b may be formed on the first recess portion 158a and the second recess portion 158b, respectively. The first blocking layer 162a and the second blocking layer 162b protrude toward the first conductive line CL1 and the second conductive line CL2, respectively, and may extend from the insulating film 162 for a spacer. The third blocking layer 162c protrudes toward the first insulating layer 130a and may extend from the insulating film 162 for a spacer.

Figure 11:
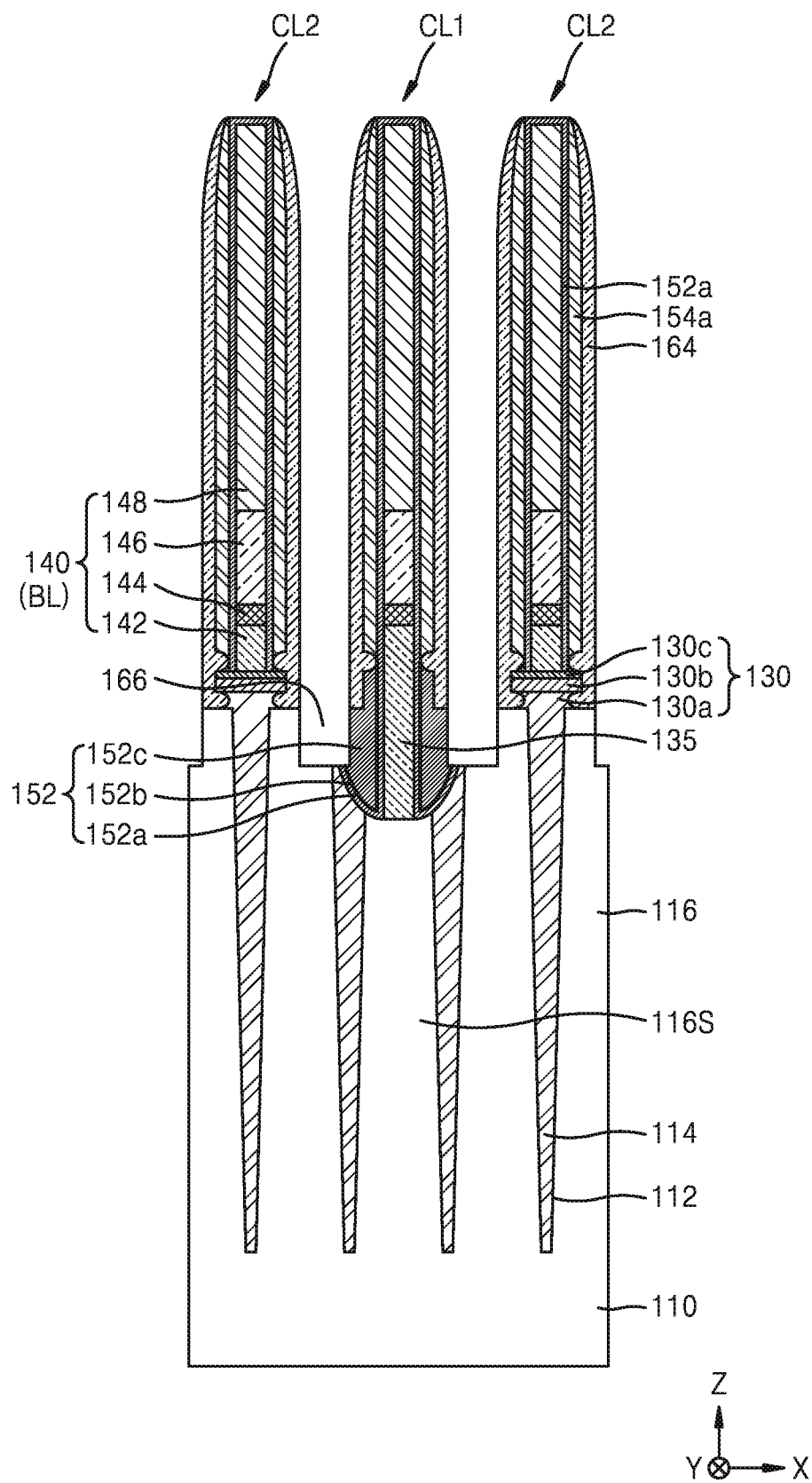
Figure 12:
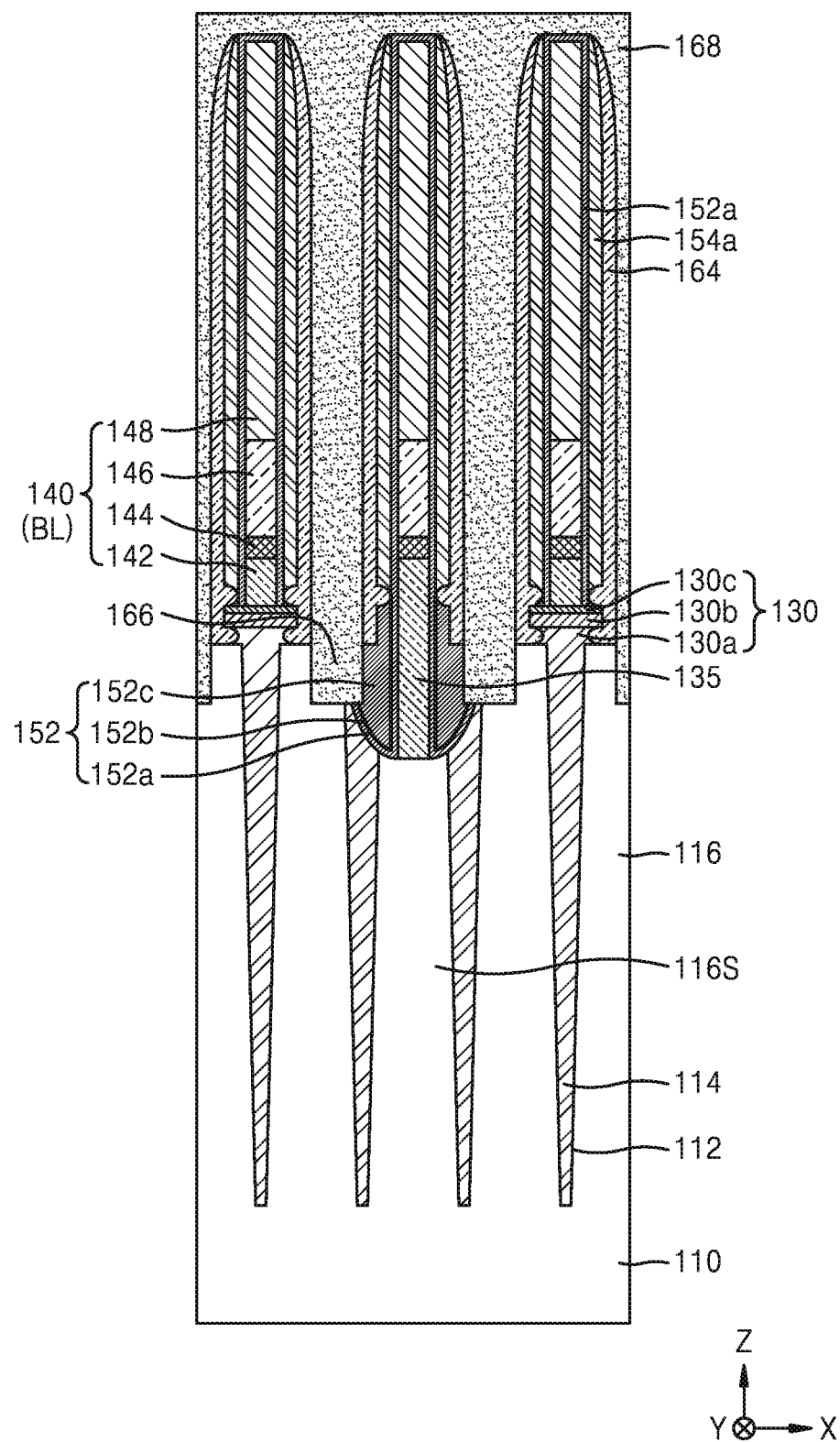

Referring to FIGS. 11 and 12, as shown in FIG. 11, the first insulating liner 152a formed on the bit line BL 140 and the interlayer insulating layer 130 is used as an etch stop film, and the insulating film 162 (of FIG. 10A) for a spacer and a portion on the substrate 110 are etched back to form the second external spacer 164 and a contact hole 166. A buried contact may be formed in the contact hole 166 through a subsequent manufacturing process.

Next, as shown in FIG. 12, a conductive layer 168 is formed on a front surface of a resultant product in which the bit line BL 140 and the second external spacer 164 are formed while the contact hole 166 is filled. That is, the conductive layer 168 is formed to fill the contact hole 166 between the first to third conductive lines CL1 to CL3.

Figure 13:
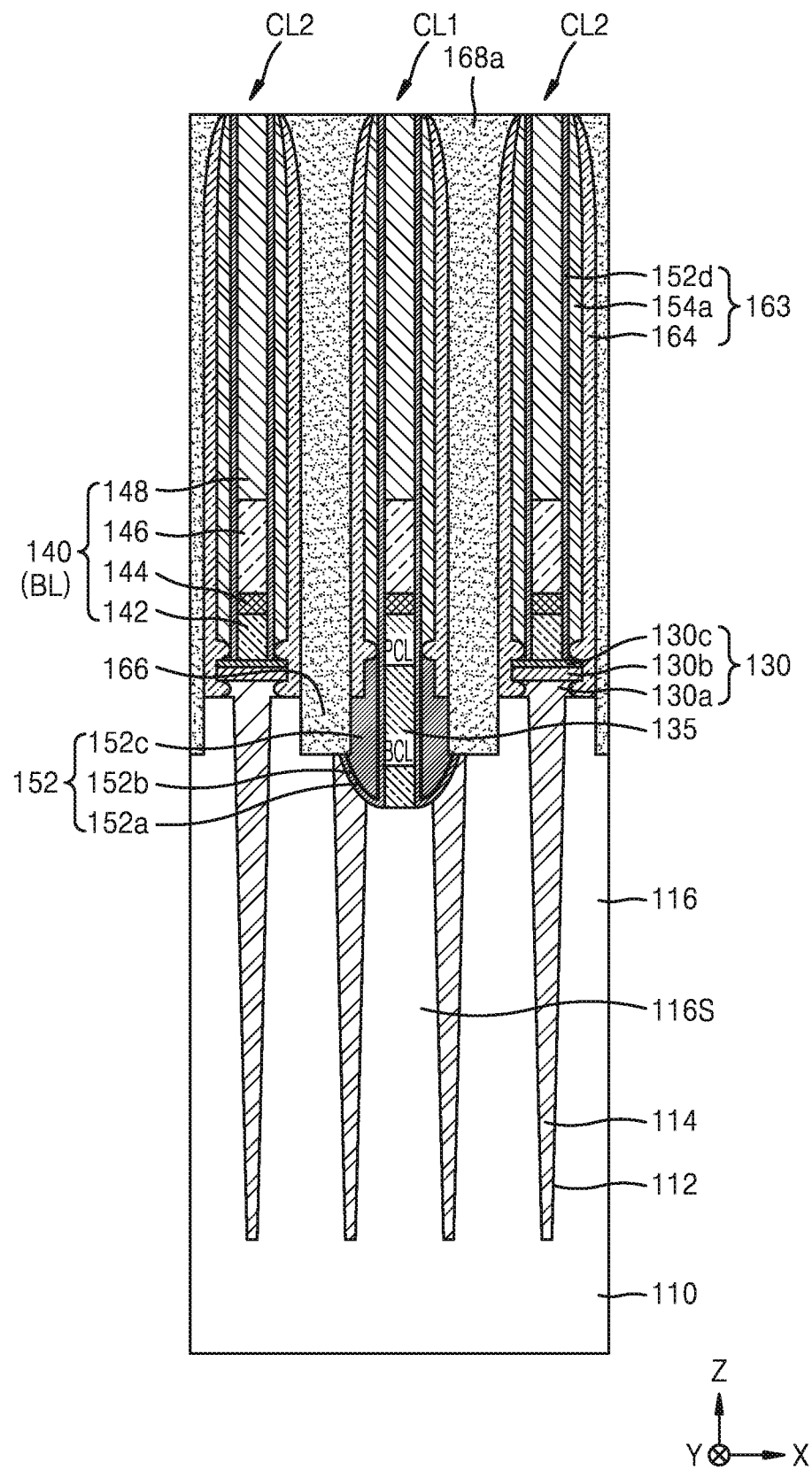
Figure 14:
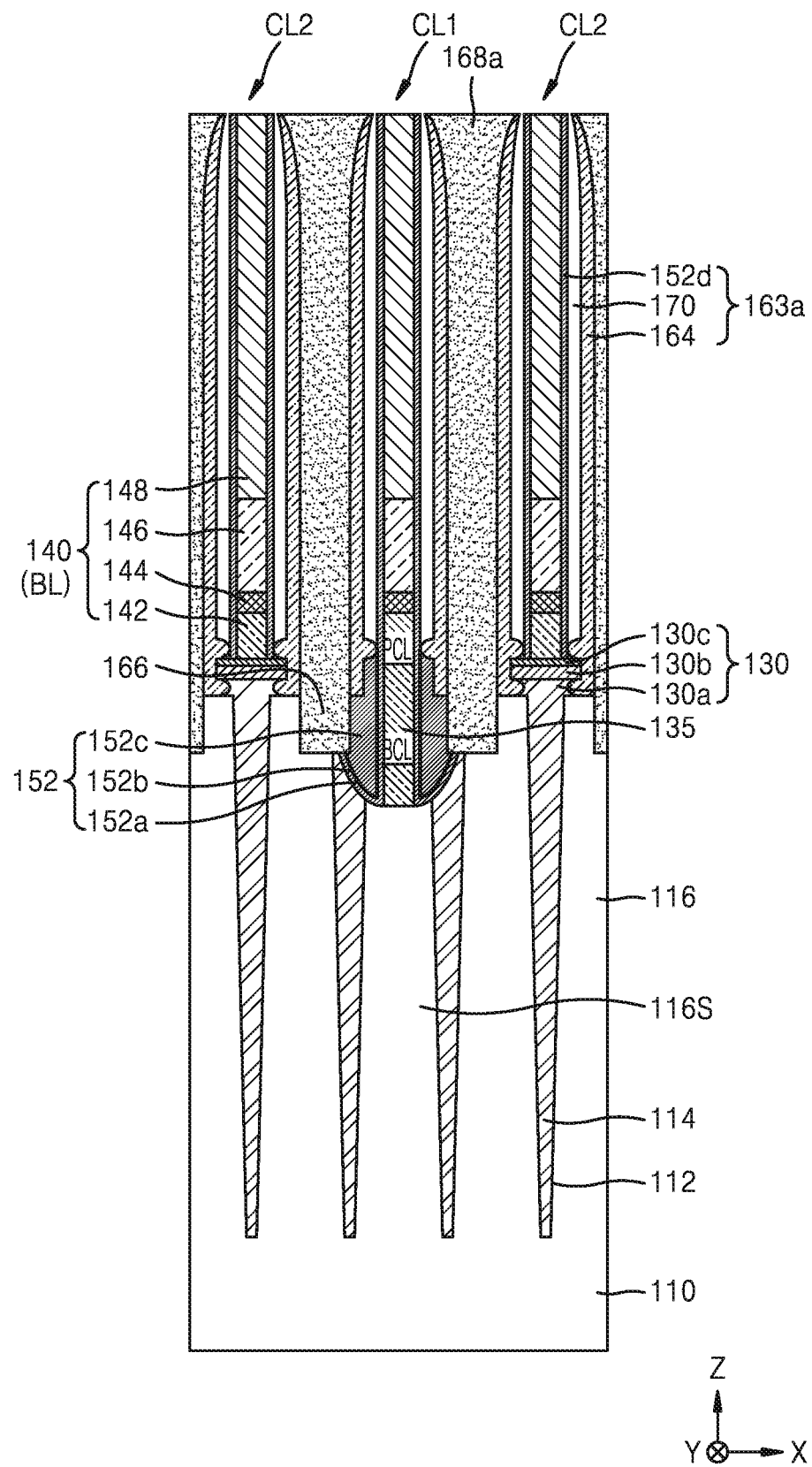

Referring to FIGS. 13 and 14, the first insulating liner 152a on the conductive layer 168 and the bit line BL 140 is etched back as shown in FIG. 13. Thus, the spacer 163 is formed on the sidewalls of the bit line BL 140, that is, on one sidewall of the first conductive line CL1 and the second conductive line CL2. A spacer 163 includes the internal spacer 152d formed on one sidewall of the bit line BL 140 and the first external spacer 154a and the second external spacer 164 that are sequentially formed on one sidewall of the internal spacer 152d.

The first external spacer 154a is etched to form an air spacer 170 as shown in FIG. 14. The spacer 163a includes the internal spacer 152d formed on one sidewall of the bit line BL 140 and the first air spacer 170 and the second external spacer 164 that are sequentially formed on one sidewall of the internal spacer 152d. A semiconductor device may be manufactured through such a manufacturing process.

FIGS. 15 to 22 are cross-sectional views of a main part of a semiconductor device for explaining a method of manufacturing the semiconductor device, according to at least one embodiment of the inventive concepts.

In more detail, FIGS. 15 to 22 are cross-sectional views of a main part of a semiconductor device taken along line I-I' of FIG. 1. In FIGS. 5 to 22, the same reference numerals as in FIGS. 2 and 3 denote the same elements. FIGS. 5 to 22 may be the same as FIGS. 4 to 14 except that an additional external spacer 204 is further formed on one sidewall of the first external spacer 154a. In FIGS. 15 to 22, the same reference numerals like in FIGS. 4 to 14 denote the same elements, and repeated descriptions thereof will not be given herein.

Figure 15:
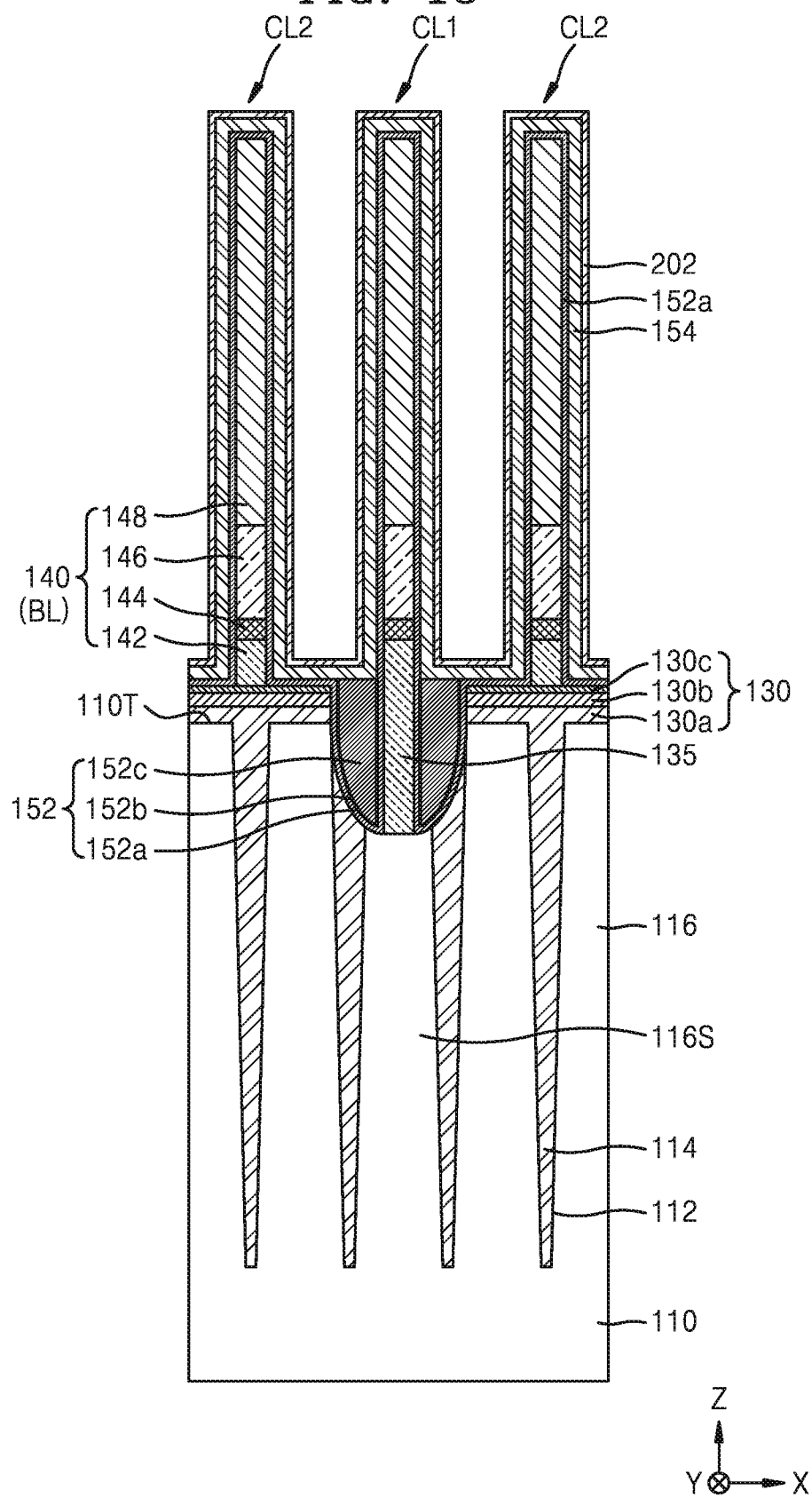
FIGS. 15 to 22 are cross-sectional views of a main part of a semiconductor device for explaining a method of manufacturing the semiconductor device, according to a least one embodiment of the inventive concepts.

Referring to FIG. 15, the manufacturing processes of FIGS. 4 to 6 is performed as described above. Next, a material film 202 for oxidation is formed on the front surface of the substrate 110 on which the insulating film 154 for a spacer is formed, as shown in FIG. 15. The material film 202 for oxidation may be formed on the insulating film 154 for a spacer on the sidewalls and surface of the bit line BL 140. The material film 202 for oxidation may include a material that can be converted into a silicon oxide layer by heat treatment. The material film 202 for oxidation may include a polysilicon film.

Figure 16:
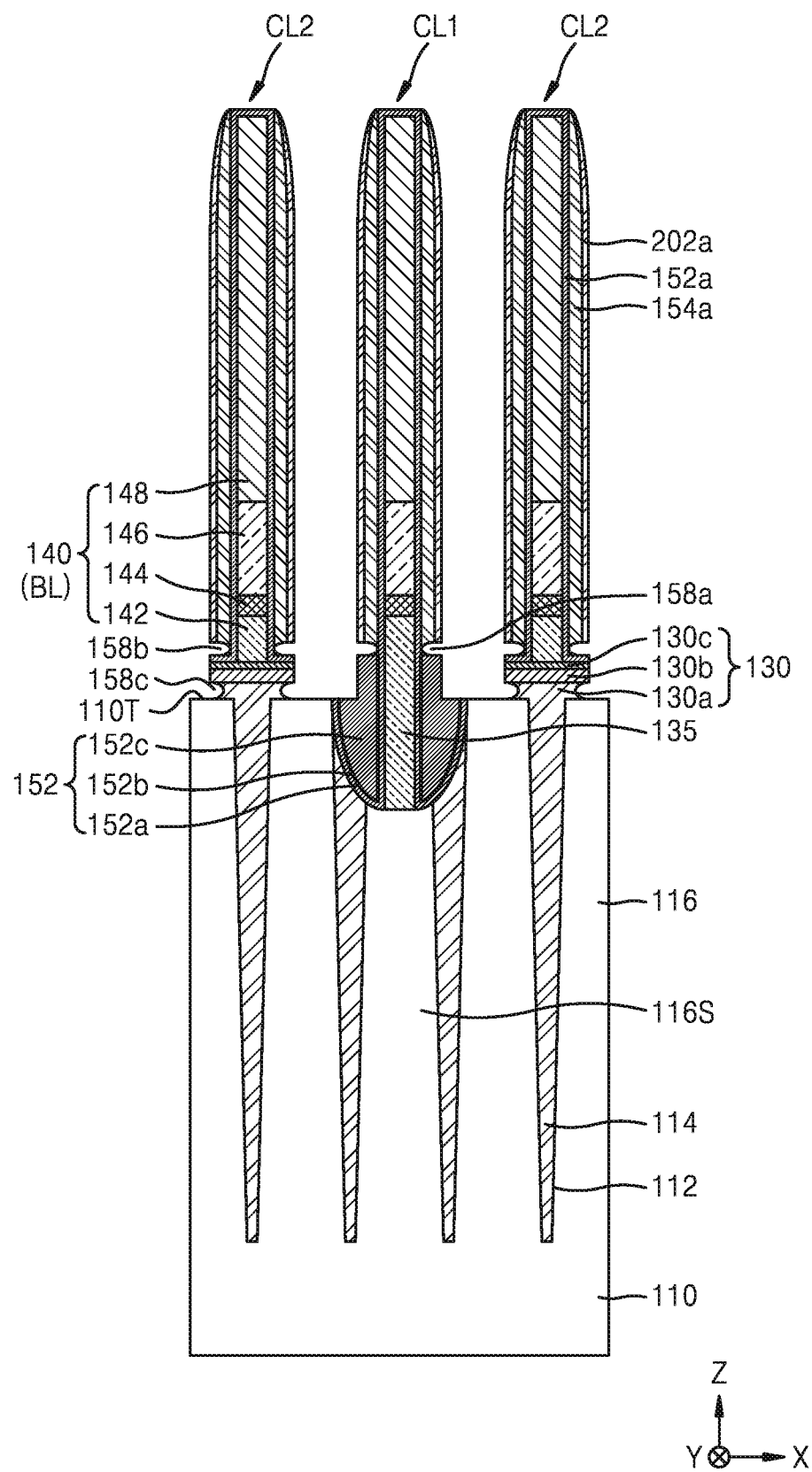
Figure 17A:
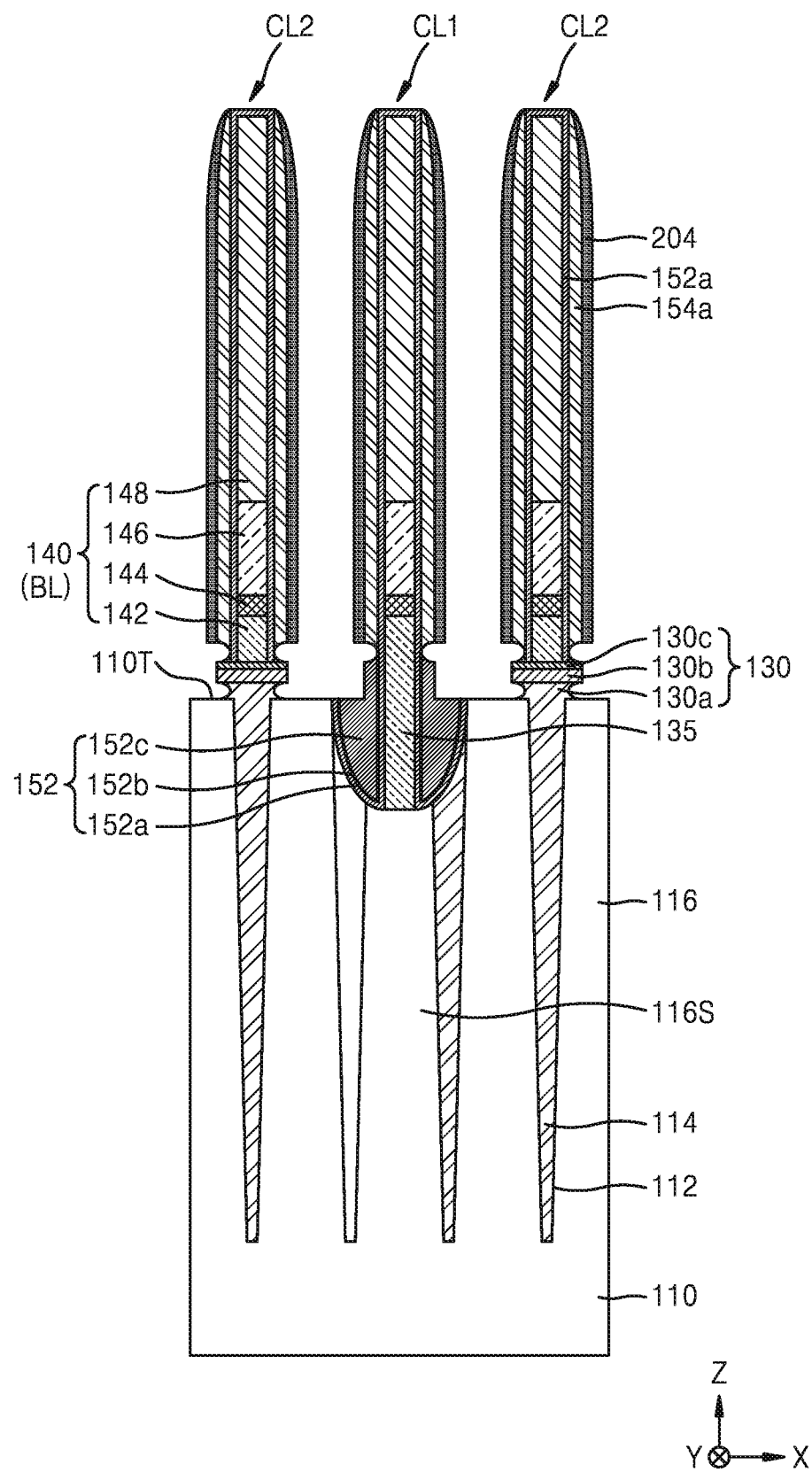
Figure 17B:
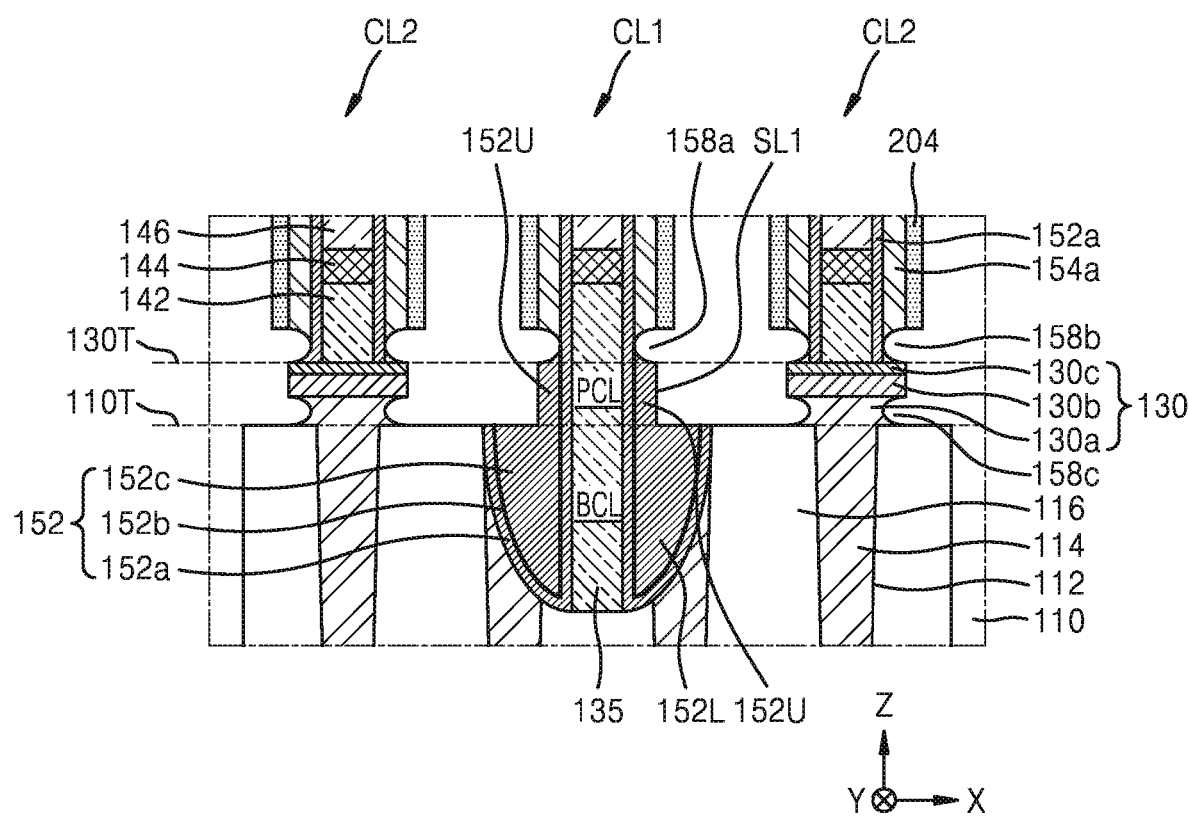

Referring to FIGS. 16, 17A, and 17B, FIG. 17A shows a state in which a material spacer 202a for oxidation shown in FIG. 16 is formed. FIG. 17B is a partial enlarged view of FIG. 17A.

Referring to FIG. 16, the first insulating liner 152a formed on the bit line BL 140 and the interlayer insulating layer 130 is used as an etch stop film and the material film 202 (of FIG. 15) for oxidation, the insulating film 154 (of FIG. 15) for a spacer, and the third insulating liner 152c are etched back to form the first external spacer 154a and the material spacer 202a for oxidation. The first external spacer 154a may be an air spacer as described later below.

When the first external spacer 154a and the material spacer 202a for oxidation are formed, the insulating film 154 for a spacer and the material film 202 for oxidation on the first insulating liner 152a on the surfaces of the bit line BL 140 may be removed. When the first external spacer 154a and the material spacer 202a for oxidation are formed, the material film 202 for oxidation and the insulating film 154 for a spacer on the first insulating liner 152a on the interlayer insulating layer 130 between first to third conductive lines CL1 to CL3 may be removed.

Also, when the first external spacer 154a and the material spacer 202a for oxidation are formed, the third insulating liner 152c on the surface 110T of the substrate 110 among the insulating liners 152 may also be etched. Accordingly, as shown in FIG. 17B, the insulating liners 152 may be divided into the upper insulating liners 152U and the lower insulating liners 152L, the upper insulating liners 152U being higher than the surface 110T of the substrate on both sides of the protruded conductive line PCL and the lower insulating liners 152L being lower than the surface 110T of the substrate on both sides of the buried conductive line BCL.

When the first external spacer 154a and the material spacer 202a for oxidation are formed, the sidewall SL1 of the upper insulating liners 152U may be perpendicular to the surface 110T of the substrate 110. When the sidewall SL1 of the upper insulating liners 152U are vertical, the lower opening length CR1 of the buried contact BC may be extended as described above, and thus, device characteristics, for example, contact resistance may be lowered. In addition, the first external spacer 154a and the material spacer 202a for oxidation may be formed on the first insulating liner 152a on the sidewalls of the bit line BL 140 through the preceding manufacturing process.

Next, the first recess portion 158a, the second recess portion 158b, and the additional recess portion 158c are formed by etching the lower portion of the first external spacer 154a and the first insulating layer 130a using the material spacer 202a for oxidation as an etch mask. The first recess portion 158a, the second recess portion 158b, and the additional recess portion 158c will be omitted as being described above.

Subsequently, the material spacer 202a for oxidation is oxidized to form the additional external spacer 204 outside the first external spacer 154a. The oxidation of the material spacer 202a for oxidation may be performed using a wet annealing process.

Figure 18A:
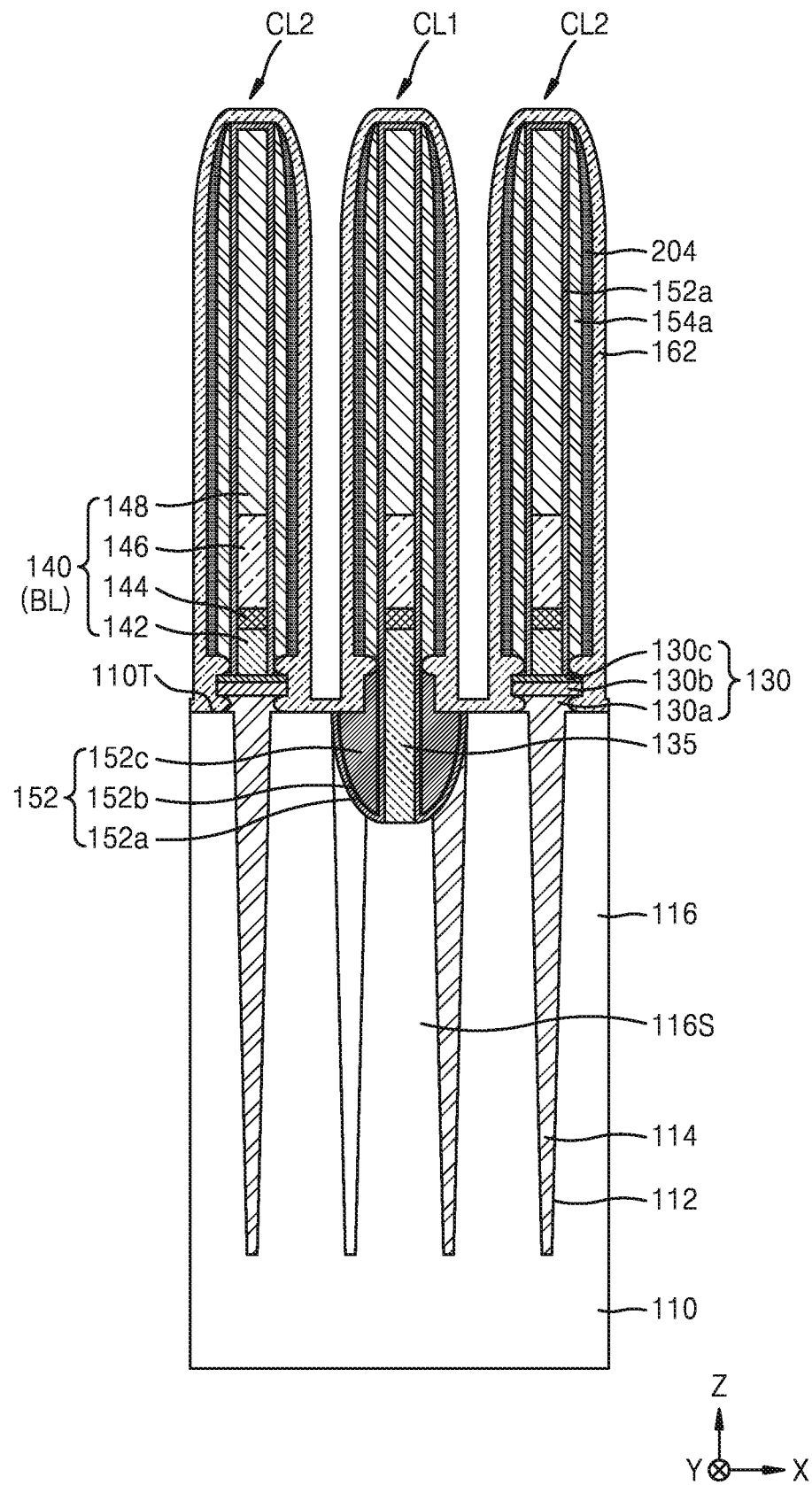
Figure 18B:
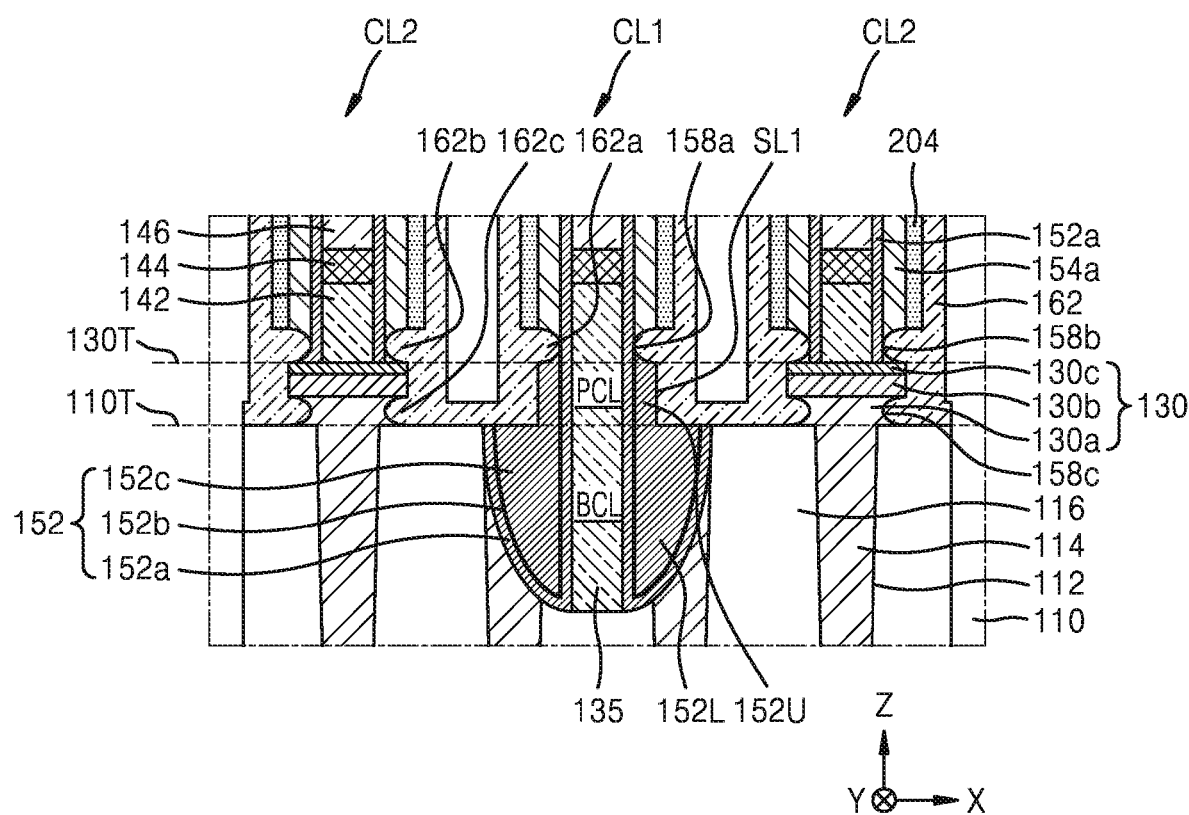

Referring to FIGS. 18A and 18B, the insulating film 162 for a spacer is formed on a front surface of the substrate 110 on which the first external spacer 154a on the sidewalls and surface of the bit line BL 140, the insulating liners 152, and the interlayer insulating layer 130 are formed while the first recess portion 158a, the second recess portion 158b, and the additional recess portion 158c are filled. The insulating film 162 for a spacer may include a silicon nitride layer. The insulating film 154 for a spacer may be an external spacer through a subsequent manufacturing process.

Accordingly, the first blocking layer 162a and the second blocking layer 162b may be formed on the first recess portion 158a and the second recess portion 158b, respectively. The first blocking layer 162a and the second blocking layer 162b protrude toward the first conductive line CL1 and the second conductive line CL2, respectively, and may extend from the insulating film 162 for a spacer. The third blocking layer 162c protrudes toward the first insulating layer 130a and may extend from the insulating film 162 for a spacer.

Figure 19:
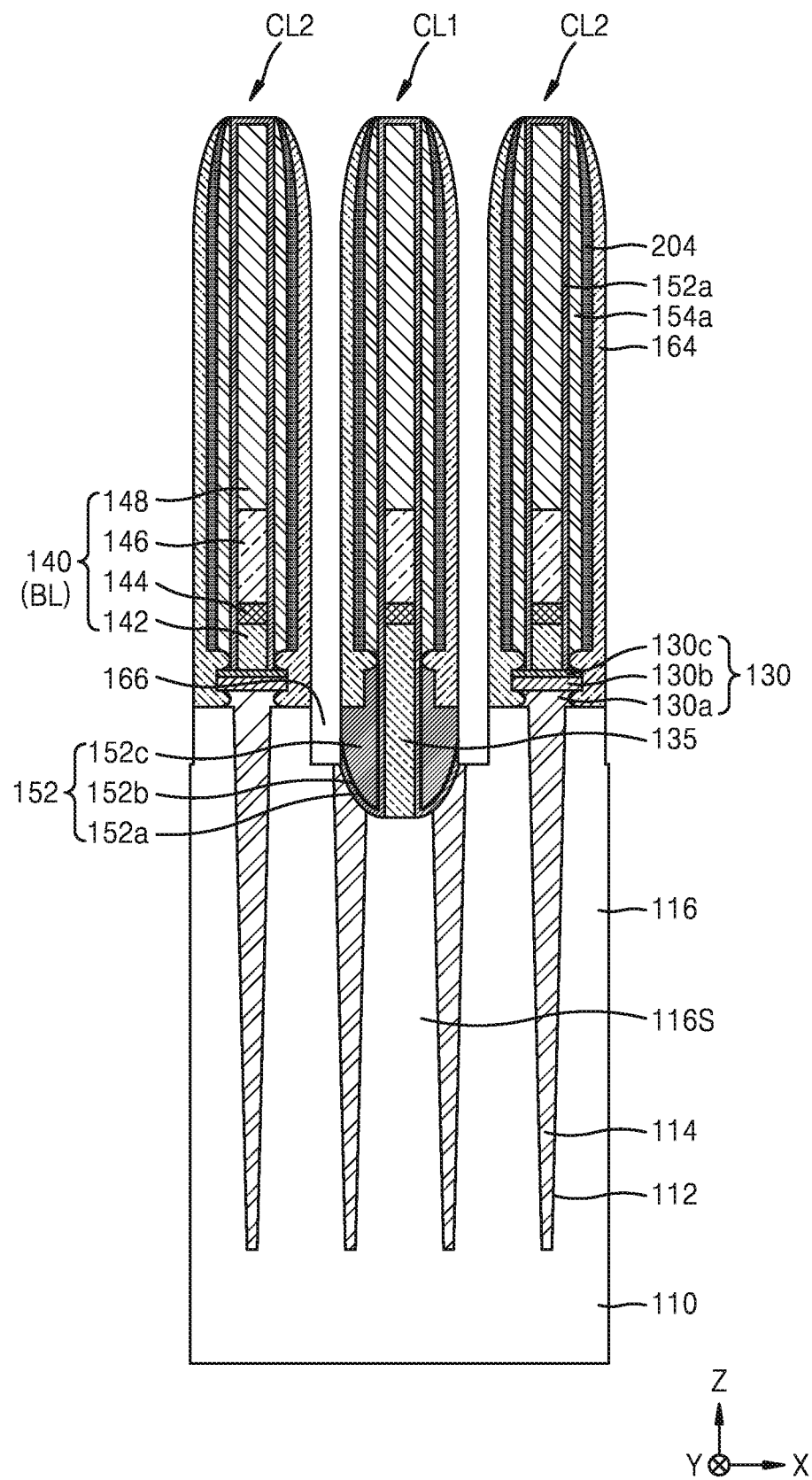
Figure 20:
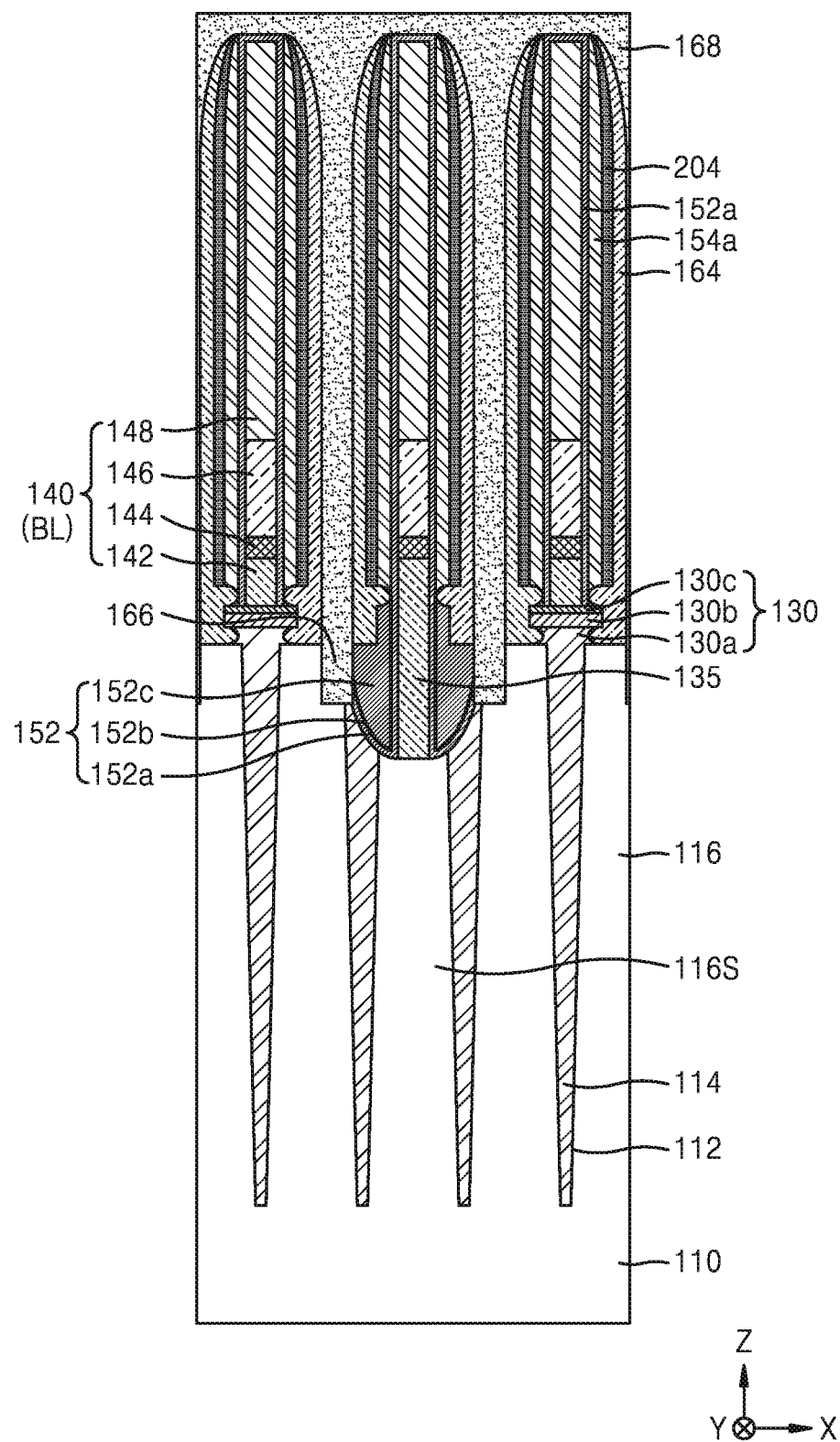

Referring to FIGS. 19 and 20, as shown in FIG. 19, the first insulating liner 152a formed on the bit line BL 140 and the interlayer insulating layer 130 is used as an etch stop film, and the insulating film 162 (of FIG. 18) for a spacer and a portion on the substrate 110 are etched back to form the second external spacer 164 and the contact hole 166. A buried contact may be formed in the contact hole 166 through a subsequent manufacturing process.

Next, as shown in FIG. 20, the conductive layer 168 is formed on a front surface of a resultant product in which the bit line BL 140 and the second external spacer 164 are formed while the contact hole 166 is filled. That is, the conductive layer 168 is formed to fill the contact hole 166 between the first to third conductive lines CL1 to CL3.

Figure 21:
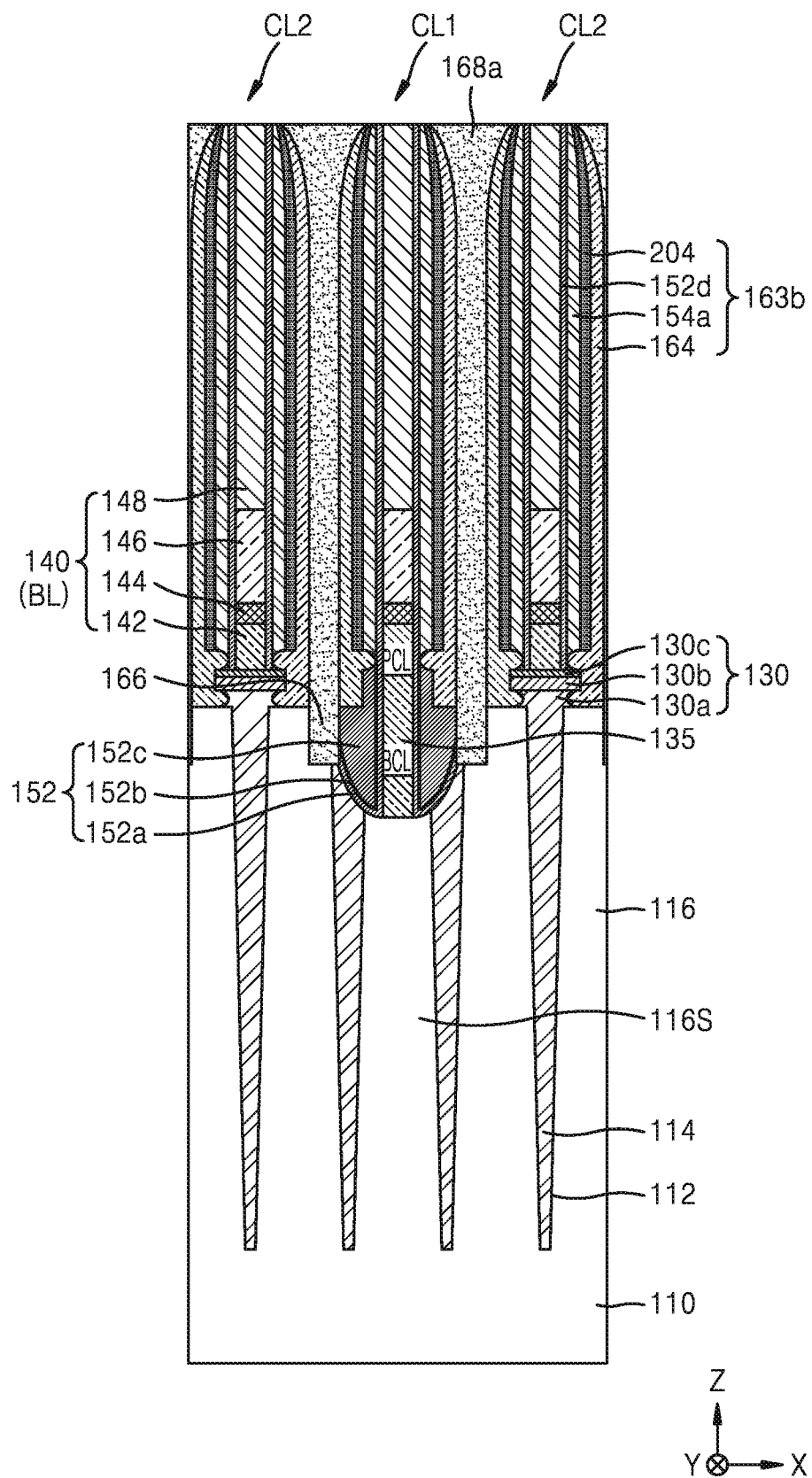
Figure 22:
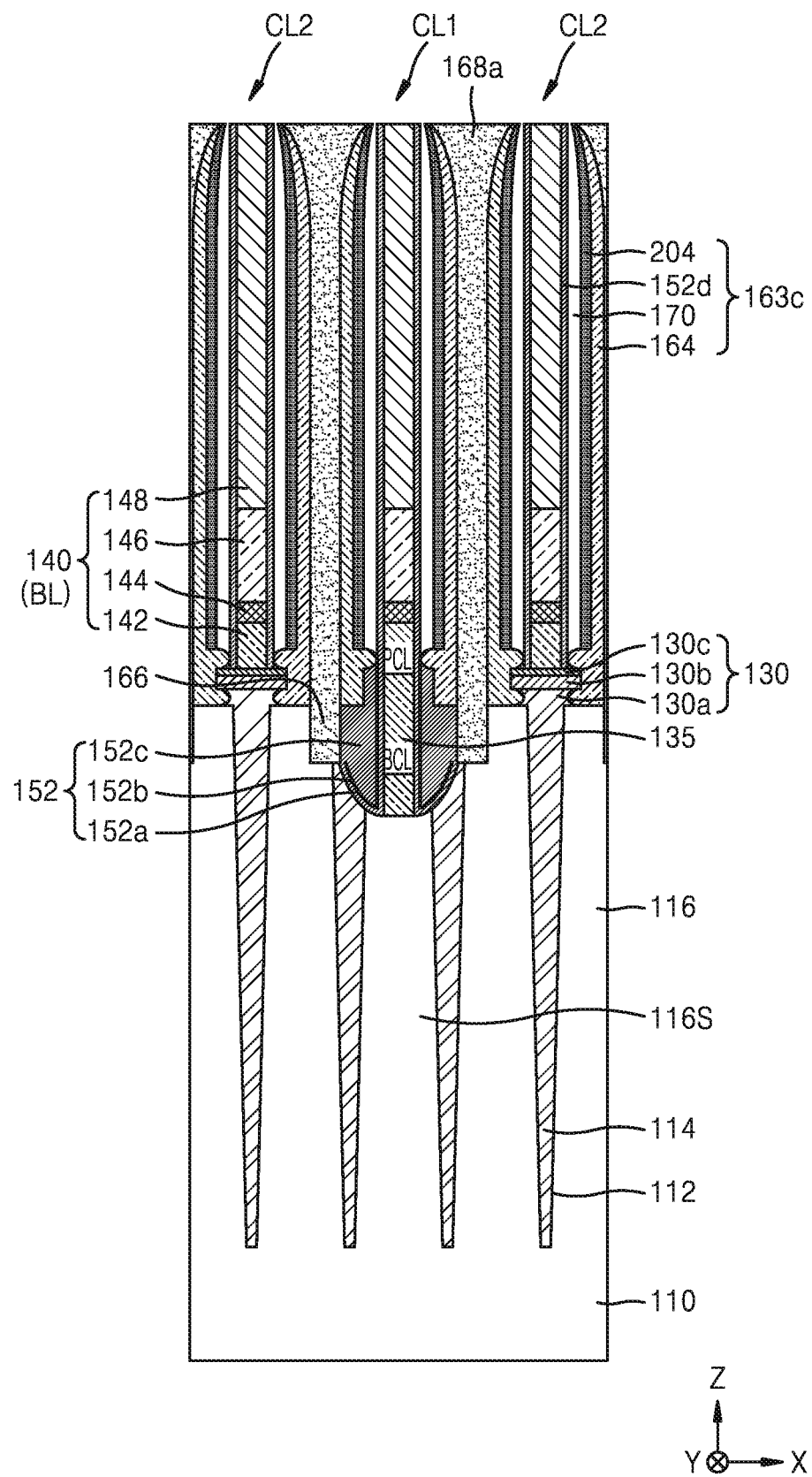

Referring to FIGS. 21 and 22, the first insulating liner 152a on the conductive layer 168 and the bit line BL 140 is etched back as shown in FIG. 21. Thus, a spacer 163b is formed on a sidewall of the bit line BL 140, that is, on one sidewall of the first conductive line CL1 and the second conductive line CL2. The spacer 163 includes the internal spacer 152d formed on one sidewall of the bit line BL 140, and the first external spacer 154a, the additional external spacer 204, and the second external spacer 164 that are sequentially formed on one sidewall of the internal spacer 152d.

The first external spacer 154a is etched to form the air spacer 170 as shown in FIG. 22. The spacer 163 includes the internal spacer 152d formed on one sidewall of the bit line BL 140, and the first external spacer 154a, the additional external spacer 204, and the second external spacer 164 that are sequentially formed on one sidewall of the internal spacer 152d. A semiconductor device may be manufactured through such a manufacturing process.

Figure 23:
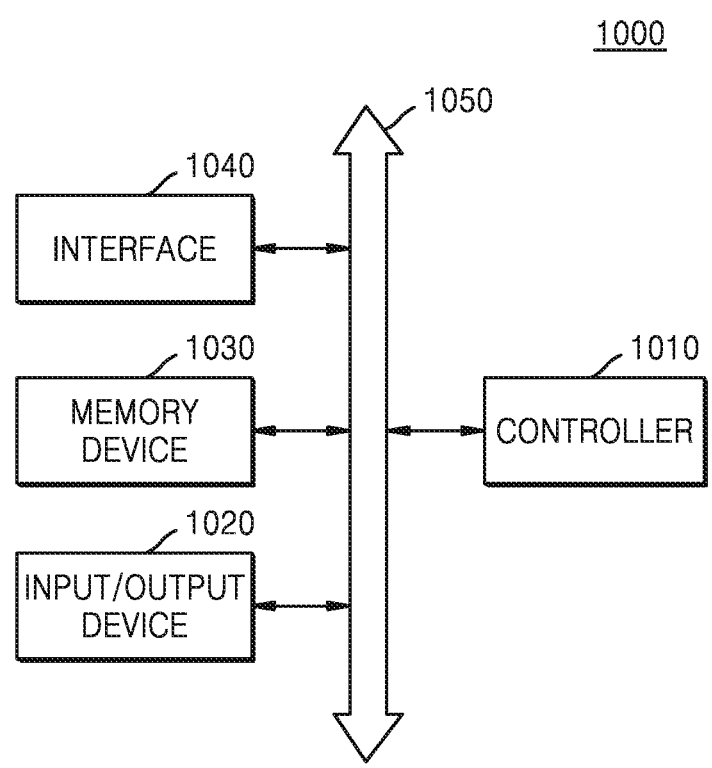
FIG. 23 is a view of a system including a semiconductor device according to at least one embodiment of the inventive concepts.

FIG. 23 is a view of a system including a semiconductor device according to at least one embodiment of the inventive concepts.

In more detail, a system 1000 according to at least one embodiment may include a controller 1010, an input/output device 1020, a memory device 1030, and/or an interface 1040. The electronic system 1000 may be a mobile system or a system for transmitting and receiving information. In at least one embodiment, the mobile system may be a personal digital assistant (PDA), a portable computer, a web tablet, a wireless phone, a mobile phone, a digital music player, or a memory card.

The controller 1010, to control an executable program of the system 1000, may include a microprocessor, a digital signal processor, a microcontroller, or similar devices. The input/output device 1020 may be used to input and output data of the system 1000. The system 1000 may be connected to an external device, for example, a PC or a network by using the input/output device 1020, and may exchange data with the external device. The input/output device 1020 may be, for example, a keypad, a keyboard, or a display.

The memory device 1030 may store code and/or data for an operation of the controller 1010 or data processed in the controller 1010. The memory device 1030 may include a semiconductor device according to at least one embodiment of the inventive concepts. For example, the memory device 1030 may include a semiconductor device manufactured by the above-described method.

The interface 1040 may be a data transmission path between the system 1000 and an external device. The controller 1010, the input/output device 1020, the memory device 1030, and the interface 1040 may communicate with each other via a bus 1050.

The system 1000 according to at least one embodiment may be used in a mobile phone, an MP3 player, navigation, a portable multimedia player (PMP), a solid state disk (SSD), or household appliances.

A semiconductor device of the inventive concepts may improve device characteristics without being short-circuited even when a distance between a conductive line and a contact pattern is reduced. The semiconductor device of the inventive concepts may lower device characteristics, such as contact resistance, by making sidewalls of upper insulating liners vertical and increasing a lower length of a buried contact.

While the inventive concepts have been particularly shown and described with reference to embodiments thereof, it will be understood that various changes in form and details may be made therein without departing from the spirit and scope of the following claims.

What is claimed is:

1. A semiconductor device comprising:
a substrate having a plurality of active regions defined by a device isolation region;
a conductive line extending in a direction on the active regions of the substrate;
a plurality of insulating liners on both sidewalls of a lower portion of the conductive line that is in contact with the active regions;
a plurality of spacers apart from the insulating liners in a direction perpendicular to a surface of the substrate and sequentially on both sidewalls of an upper portion of the conductive line;
a blocking layer between a spacer in the middle of the spacers and the insulating liners and in a recess portion recessed from one end of the spacer in the middle of the spacers toward the conductive line; and
conductive patterns on the active regions on both sides of the spacers.

2. The semiconductor device of claim 1, wherein an outermost spacer among the plurality of spacers extends in a vertical direction of the substrate between the insulating liners and the conductive patterns.

3. The semiconductor device of claim 1, wherein the conductive line comprises a protruded conductive line protruding from the surface of the substrate and a buried conductive line below the surface of the substrate.

4. The semiconductor device of claim 3, wherein the plurality of insulating liners include upper insulating liners and lower insulating liners, the upper insulating liners being higher than the surface of the substrate on both sides of the protruded conductive line and the lower insulating liners being lower than the surface of the substrate on both sides of the buried conductive line, and
a sidewall of the upper insulating liners on a side of the conductive patterns is perpendicular to the surface of the substrate.

5. The semiconductor device of claim 1, wherein the plurality of insulating liners comprise a first insulating liner, a second insulating liner, and a third insulating liner that sequentially arranged from one sidewall of the conductive line.

6. The semiconductor device of claim 1, wherein the blocking layer in the recess portion has a rectangular or round cross-sectional shape toward the conductive line.

7. The semiconductor device of claim 1, wherein the plurality of spacers comprise an internal spacer on one sidewall of the conductive line and a plurality of external spacers sequentially arranged on one sidewall of the internal spacer.

8. The semiconductor device of claim 7, wherein the plurality of external spacers comprise a first external spacer and a second external spacer sequentially arranged on one sidewall of the internal spacer, and the blocking layer is below the first external spacer.

9. The semiconductor device of claim 7, wherein the plurality of external spacers comprise a first external spacer, an additional external spacer, and a second external spacer sequentially arranged on one sidewall of the internal spacer, and the blocking layer is below the first external spacer and the additional external spacer.

10. The semiconductor device of claim 1, wherein the plurality of spacers comprise an internal spacer on one sidewall of the conductive line and an air spacer and an external spacer sequentially arranged on one sidewall of the internal spacer, and the blocking layer is below the air spacer.

11. A semiconductor device comprising:
a substrate having a plurality of active regions defined by a device isolation region;
an interlayer insulating layer on the device isolation region;
a conductive line extending in a direction on the interlayer insulating layer of the substrate;
a plurality of spacers apart from the interlayer insulating layer in a direction perpendicular to a surface of the substrate and on both sidewalls of the conductive line;
a blocking layer at a spacing between a spacer in the middle of the spacers and the interlayer insulating layer and in a recess portion recessed from one end of the spacer located in the middle of the spacers toward the conductive line; and
conductive patterns on the active regions on both sides of the spacers.

12. The semiconductor device of claim 11, wherein the interlayer insulating layer comprises a plurality of insulating layers on the device isolation region.

13. The semiconductor device of claim 11, wherein the interlayer insulating layer further comprises an additional recess portion recessed inwardly, wherein the additional recess portion comprises an additional blocking layer.

14. The semiconductor device of claim 13, wherein the blocking layer and the additional blocking layer comprise the same material as that of an outermost external spacer among the spacers.

15. The semiconductor device of claim 11, wherein internal spacers on both sidewalls of the conductive line among the spacers are on the interlayer insulating layer.

16. A semiconductor device comprising:
a substrate having a plurality of active regions defined by a device isolation region;
an interlayer insulating layer on the device isolation region;
a conductive line extending in a direction on the active regions of the substrate and the interlayer insulating layer;
a plurality of insulating liners on both sidewalls of a lower portion of the conductive line that is in contact with the active regions;
a plurality of spacers apart from the insulating liners and the interlayer insulating layer in a direction perpendicular to a surface of the substrate and sequentially formed on both sidewalls of an upper portion of the conductive line;
a blocking layer between a spacer in the middle of the spacers and the insulating liners and the interlayer insulating layer and in a recess portion recessed from one end of the spacer located in the middle of the spacers toward the conductive line; and
conductive patterns on the active regions on both sides of the spacers.

17. The semiconductor device of claim 16, wherein the conductive line comprises a protruded conductive line protruding from the surface of the substrate, wherein upper insulating liners being higher than the surface of the substrate are on both sides of the protruded conductive line, and a sidewall of the upper insulating liners on a side of the conductive patterns is perpendicular to the surface of the substrate.

18. The semiconductor device of claim 16, wherein the plurality of spacers comprise an internal spacer on one sidewall of the conductive line and a plurality of external spacers sequentially arranged on one sidewall of the internal spacer, and the blocking layer is below one of the external spacers.

19. The semiconductor device of claim 16, wherein the blocking layer comprises the same material as that of an outermost external spacer among the spacers.

20. The semiconductor device of claim 16, wherein the interlayer insulating layer comprises an additional recess portion recessed inwardly, wherein the additional recess portion comprises an additional blocking layer.

* * * * *